(12) United States Patent
Jacobson et al.

(10) Patent No.: US 6,323,989 B1
(45) Date of Patent: Nov. 27, 2001

(54) ELECTROPHORETIC DISPLAYS USING NANOPARTICLES

(75) Inventors: Joseph M. Jacobson, Newton Centre; Paul S. Drzaic, Lexington; Ian D. Morrison, Acton, all of MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 09/565,417

(22) Filed: May 5, 2000

Related U.S. Application Data

(60) Continuation-in-part of application No. 09/471,024, filed on Dec. 23, 1999, which is a division of application No. 08/935,800, filed on Sep. 23, 1997, now abandoned, which is a continuation-in-part of application No. PCT/US96/13469, filed on Aug. 20, 1996.

(60) Provisional application No. 60/035,622, filed on Sep. 24, 1996, provisional application No. 60/022,222, filed on Jul. 19, 1996, provisional application No. 60/132,644, filed on May 5, 1999, provisional application No. 60/132,643, filed on May 5, 1999, and provisional application No. 60/134,245, filed on May 12, 1999.

(30) Foreign Application Priority Data

Dec. 28, 1998 (JP) .................................... 10-373144

(51) Int. Cl.$^7$ ........................................ G09G 3/34
(52) U.S. Cl. ........................................ 359/296; 345/107
(58) Field of Search ............... 345/107, 86; 359/296, 359/529, 530, 536, 538, 539, 541; 349/86, 89

(56) References Cited

U.S. PATENT DOCUMENTS

| | | |
|---|---|---|
| 3,036,388 | 5/1962 | Tate .......................... 35/66 |
| 3,406,363 | 10/1968 | Tate .......................... 335/302 |
| 3,460,248 | 8/1969 | Tate .......................... 29/607 |
| 3,668,106 | 6/1972 | Ota .......................... 204/299 |
| 3,670,323 | 6/1972 | Sobel et al. ................. 340/324 |

(List continued on next page.)

FOREIGN PATENT DOCUMENTS

| | | |
|---|---|---|
| 0 186 710A1 | 7/1986 | (EP) . |
| 0 268 877A2 | 6/1988 | (EP) . |
| 0 281 204A2 | 9/1988 | (EP) . |
| 0 443 571A2 | 8/1991 | (EP) . |
| 0 525 852A1 | 2/1993 | (EP) . |

(List continued on next page.)

OTHER PUBLICATIONS

Bawendi, M.G., "Namocrystalites: Building Blocks for Quantum Dot Heterostructures", Solid State Comm., 107(11), 709 (1998).

Beilin, S., et al, "8.5: 2000–Character Electrophoretic Display", SID 86 Digest, 136 (1986).

Bohnke et al., "Polymer–Based Solid Electrochromic Cell for Matrix–Addressable Display Devices." J. Electrochem. Soc., 138, 3612 (1991).

(List continued on next page.)

*Primary Examiner*—Hung Xuan Dang
(74) *Attorney, Agent, or Firm*—David J. Cole

(57) ABSTRACT

An electrophoretic display comprises a fluid and a plurality of nanoparticles having diameters substantially less the wavelengths of visible light such that, when the nanoparticles are in a dispersed state and uniformly dispersed throughout the fluid, the fluid presents a first optical characteristic, but when the nanoparticles are in an aggregated state in which they are gathered into aggregates substantially larger than the individual nanoparticles, the fluid presents a second optical characteristic different from the first optical characteristic. The electrophoretic display further comprises at least one electrode arranged to apply an electric field to the nanoparticle-containing fluid and thereby move the nanoparticles between their dispersed and aggregated states.

28 Claims, 11 Drawing Sheets

U.S. PATENT DOCUMENTS

| | | | |
|---|---|---|---|
| 3,756,693 | 9/1973 | Ota | 350/160 |
| 3,767,392 | 10/1973 | Ota | 96/1 |
| 3,792,308 | 2/1974 | Ota | 315/150 |
| 3,892,568 | 7/1975 | Ota | 96/1.3 |
| 4,062,009 | 12/1977 | Raverdy et al. | 340/324 R |
| 4,093,534 | 6/1978 | Carter et al. | 350/355 |
| 4,126,528 | 11/1978 | Chiang | 204/180 |
| 4,126,854 | 11/1978 | Sheridon | 340/373 |
| 4,143,103 | 3/1979 | Sheridon | 264/4 |
| 4,143,472 | 3/1979 | Murata et al. | 35/66 |
| 4,231,641 | 11/1980 | Randin | 350/357 |
| 4,261,653 | 4/1981 | Goodrich | 350/362 |
| 4,272,596 | 6/1981 | Harbour et al. | 430/37 |
| 4,298,448 | 11/1981 | Muller et al. | 204/299 R |
| 4,305,807 | 12/1981 | Somlyody | 204/299 R |
| 4,311,361 | 1/1982 | Somlyody | 350/267 |
| 4,368,952 | 1/1983 | Murata et al. | 350/362 |
| 4,390,403 | 6/1983 | Batchelder | 204/180 R |
| 4,418,346 | 11/1983 | Batchelder | 340/787 |
| 4,419,383 | 12/1983 | Lee | 427/47 |
| 4,438,160 | 3/1984 | Ishikawa et al. | 427/214 |
| 4,620,916 | 11/1986 | Zwemer et al. | 204/299 |
| 4,643,528 | 2/1987 | Bell, Jr. | 350/334 |
| 4,726,662 | 2/1988 | Cromack | 350/345 |
| 4,772,102 | 9/1988 | Fergason et al. | 350/338 |
| 4,824,208 | 4/1989 | Fergason et al. | 350/276 |
| 4,832,458 | 5/1989 | Fergason et al. | 350/338 |
| 5,017,225 | 5/1991 | Nakanishi et al. | 106/21 |
| 5,057,363 | 10/1991 | Nakanishi | 428/321.5 |
| 5,105,185 | 4/1992 | Nakanowatari et al. | 340/784 |
| 5,151,032 | 9/1992 | Igawa | 434/409 |
| 5,187,609 | 2/1993 | DiSanto et al. | 359/296 |
| 5,262,098 | 11/1993 | Crowley et al. | 264/8 |
| 5,270,843 | 12/1993 | Wang | 359/52 |
| 5,279,511 | 1/1994 | DiSanto et al. | 445/24 |
| 5,298,833 | 3/1994 | Hou | 313/483 |
| 5,344,594 | 9/1994 | Sheridon | 264/4.1 |
| 5,360,689 | 11/1994 | Hou et al. | 430/34 |
| 5,383,008 | 1/1995 | Sheridon | 355/256 |
| 5,389,945 | 2/1995 | Sheridon | 345/85 |
| 5,398,131 | 3/1995 | Hall et al. | 359/465 |
| 5,403,518 | 4/1995 | Schubert | 252/572 |
| 5,411,398 | 5/1995 | Nakanishi et al. | 434/409 |
| 5,411,656 | 5/1995 | Schubert | 204/299 R |
| 5,498,674 | 3/1996 | Hou et al. | 525/369 |
| 5,508,068 | 4/1996 | Nakano | 428/1 |
| 5,512,162 | 4/1996 | Sachs et al. | 205/91 |
| 5,573,711 | 11/1996 | Hou et al. | 252/572 |
| 5,582,700 | 12/1996 | Bryning et al. | 204/450 |
| 5,627,561 | 5/1997 | Laspina et al. | 345/107 |
| 5,639,914 | 6/1997 | Tomiyama et al. | 564/309 |
| 5,643,673 | 7/1997 | Hou | 428/402.24 |
| 5,663,224 | 9/1997 | Emmons et al. | 524/188 |
| 5,707,738 | 1/1998 | Hou | 428/402 |
| 5,707,747 | 1/1998 | Tomiyama et al. | 428/457 |
| 5,708,525 | 1/1998 | Sheridon | 359/296 |
| 5,717,283 | 2/1998 | Biegelsen et al. | 313/483 |
| 5,717,514 | 2/1998 | Sheridon | 359/296 |
| 5,737,115 | 4/1998 | Mackinlay et al. | 359/296 |
| 5,738,977 | 4/1998 | Van Der Sluis-Van Der Vort et al. | 430/313 |
| 5,739,801 | 4/1998 | Sheridon | 345/84 |
| 5,744,283 | 4/1998 | Spierings et al. | 430/313 |
| 5,745,094 | 4/1998 | Gordon, II et al. | 345/107 |
| 5,751,268 | 5/1998 | Sheridon | 345/107 |
| 5,754,332 | 5/1998 | Crowley | 359/296 |
| 5,760,761 | 6/1998 | Sheridon | 345/107 |
| 5,767,826 | 6/1998 | Sheridon et al. | 345/84 |
| 5,961,804 | 10/1999 | Jacobson et al. | 204/606 |
| 6,017,584 | 1/2000 | Albert et al. | 427/313.3 |
| 6,118,426 | 9/2000 | Albert et al. | 345/107 |
| 6,120,588 | 9/2000 | Jacobson | 106/31.16 |
| 6,120,839 | 9/2000 | Comiskey et al. | 427/213.3 |
| 6,124,851 | 9/2000 | Jacobson | 345/206 |
| 6,130,773 | 10/2000 | Jaconson et al. | 359/296 |
| 6,130,774 | 10/2000 | Albert et al. | 359/296 |
| 6,249,271 | * 6/2001 | Albert et al. | 345/107 |
| 6,607,185 | 5/2000 | Albert et al. | 359/296 |

FOREIGN PATENT DOCUMENTS

| | | |
|---|---|---|
| 0 540 281A2 | 5/1993 | (EP) . |
| 0 721 176A2 | 7/1996 | (EP) . |
| 2 306 229A | 4/1997 | (GB) . |
| 60-189731A | 9/1985 | (JP) . |
| 62-058222A | 3/1987 | (JP) . |
| 62-231930A | 10/1987 | (JP) . |
| 01-086116A | 3/1989 | (JP) . |
| 01-086117A | 3/1989 | (JP) . |
| 01-124182A | 5/1989 | (JP) . |
| 01-142537A | 6/1989 | (JP) . |
| 02-223934A | 9/1990 | (JP) . |
| 02-223935A | 9/1990 | (JP) . |
| 02-223936A | 9/1990 | (JP) . |
| 02-284124A | 11/1990 | (JP) . |
| 02-284125A | 11/1990 | (JP) . |
| 05-165064A | 6/1993 | (JP) . |
| 05-173194A | 7/1993 | (JP) . |
| 05-307197A | 11/1993 | (JP) . |
| 06-089081A | 3/1994 | (JP) . |
| 10-149118A | 6/1998 | (JP) . |
| WO 92/20060 | 11/1992 | (WO) . |
| WO 92/21733 | 12/1992 | (WO) . |
| WO 93/02443 | 2/1993 | (WO) . |
| WO 93/04458 | 3/1993 | (WO) . |
| WO 93/04459 | 3/1993 | (WO) . |
| WO 93/05425 | 3/1993 | (WO) . |
| WO 93/07608 | 4/1993 | (WO) . |
| WO 94/24236 | 10/1994 | (WO) . |
| WO 95/02636 | 1/1995 | (WO) . |
| WO 95/05622 | 2/1995 | (WO) . |
| WO 95/06307 | 3/1995 | (WO) . |
| WO 96/07527 | 3/1995 | (WO) . |
| WO 95/10107 | 4/1995 | (WO) . |
| WO 95/15363 | 6/1995 | (WO) . |
| WO 95/19227 | 7/1995 | (WO) . |
| WO 95/27924 | 10/1995 | (WO) . |
| WO 95/33085 | 12/1995 | (WO) . |
| WO 97/04398 | 2/1997 | (WO) . |
| WO 97/35298 | 9/1997 | (WO) . |
| WO 98/03896 | 1/1998 | (WO) . |
| WO 98/19208 | 5/1998 | (WO) . |
| WO 99/10767 | 8/1998 | (WO) . |
| WO 99/10768 | 8/1998 | (WO) . |
| WO 99/10769 | 8/1998 | (WO) . |
| WO 98/41898 | 9/1998 | (WO) . |
| WO 98/41899 | 9/1998 | (WO) . |
| WO 99/47970 | 9/1999 | (WO) . |
| WO 99/53371 | 10/1999 | (WO) . |
| WO 99/53373 | 10/1999 | (WO) . |
| WO 99/56171 | 11/1999 | (WO) . |
| WO 99/59101 | 11/1999 | (WO) . |
| WO 99/60554 | 11/1999 | (WO) . |
| WO 99/67678 | 12/1999 | (WO) . |
| WO 00/03291 | 1/2000 | (WO) . |
| WO 00/03349 | 1/2000 | (WO) . |
| WO 00/05704 | 2/2000 | (WO) . |
| WO 00/20921 | 4/2000 | (WO) . |
| WO 00/20922 | 4/2000 | (WO) . |
| WO 00/20923 | 4/2000 | (WO) . |

OTHER PUBLICATIONS

Bryce, M.R., "Seeing through synthetic metals", Nature, 335. 12 (1988).

Chiang, A., "Conduction Mechanism of Charge Control Agents Used in Electrophoretic Display Devices", Proceeding of the S.I.D., 18, 275 (1977).

Clarisse, C., et al., Field–Effect Transistor with Diphthalocyanine Thin Film, Elec. Letters, 24, 675 (1988).

Croucher, M.D., et al., "Electrophoretic Display: Materials as Related to Performance", Photog. Sci. Eng., 25, 80 (1981).

Dalisa, A.L., "Electrophoretic Display Technology", IEEE Trans. Electron Dev., ED–24, 827 (1977).

Egashira et al., "A Solid Electrochromic Cell Consisting of Lu–Diphthalocyanine and Lead Fluoride", Proceeding of the S.I.D., 28, 227 (1987).

Fitzhenry, B., "Optical effects of adsorption of dyes on pigment used in electrophoretic image dipslays", Appl. Optics., 18, 3332 (1979).

Fitzhenry–Ritz, B., "Optical Properties of Electrophoretic Image Displays", Proceedings of the S.I.D., 22, 300 (1981).

Goodman, L.A., Passive Liquid Displays: Liquid Crystals, Electrophoretics and Electrochromics, Proceedings of S.I.D., 17, 30 (1976).

Gutcho, M.H., Micocapsules and Microencapsulation Techniques, Noyes Data Corp., Park Ridge NJ, (1976), pp. 65–130, 156–177, 178–193 and 278–343.

Hatano, T., et al., "18:3: Bistable Paper–White Display Device Using Cholesteric Liquid Crystals", SID 96 Digest, 269 (1996).

Ji, Y., et al., "P–50: Polymer Walls in Higher–Polymer–Content Bistable Reflective Cholesteric Displays", SID 96 Digest, 611 (1996).

Jin et al., "Optically Transparent, Electrically Composite Medium", Science, 255, 446 (1992).

Kagan, C.R., et al., "Electronic Energy Transfer in CdSe Quantum Dot Solids", Phys. Rev. Lett, 76(9), 1517–1520 (1996).

Kreibig, U., et al., "Optical Absorption of Small Metallic Particles", Surf. Sci., 156, 678–800 (1985).

Lee, "Fabrication of Magnetic Particles Displays", Proceedings of the S.I.D., 18, 283 (1977).

Lewis et al., "Gravitational, Inter–Particle and Particle–Electrode Forces in the Electrophoretic Displays", Proceedings of the S.I.D., 18, 235 (1977).

Matsumoto, H., et al., "Size Dependent Fluorescence Queching of CdS Nanocrystals Caused by TiO2 Colloids as a Potential–Variable Quencher", Langmuir, 11, 4283–4287 (1995).

Murau, P., et al., "The understanding and elimination of some suspension instabilities in an electrophoretic display", J. Appl. Phys., 49, 4820 (1978).

Murray, C.D., et al., "Synthesis and Characterization of Nearly Monodisperse CdE (E=S, Se, T) Semiconductor Nanocrystallites", J. Am. Chem. Soc., 115(19), 8709 (1993).

National Science and Technology Council, Interagency Working Group on Nanoscience, Engineering and Technology, "Nanotechnology: Research Directions: IWGN Workshop Report", Sep. 1999 (Color version available at http:/itri.loyola.edu/IWGN.Research, Directions).

National Science and Technology Council, Interagency Working Group on Nanoscience, Engineering and Technology, "Nanotechnology: Science and Technology: A Worldwide Study", Sep. 1999 Color version available at http://itri.loyola.edu/nano/IWGN.Worldwide.Study/nano.pdf).

National Science and Technology Council, Interagency Working Group on Nanoscience, Engineering and Technology, "Nanotechnology: Shaping the World Atom by Atom", Sep. 1999.

Ota et al., "Developments in Electrophoretic Displays", Proceedings of the S.I.D., 18, 243 (1977).

Ota, I., et al., "Electrophoretic display devices", Laser 75 Optoelectronics Conference Proceedings, 145 (1975).

Ota, I., et al., "Electrophoretic Image Display (EPID) Panel", Proceedings of the IEEE, 61, 832 (1973).

Saitoh, M., et al., "A newly developed electrical twisting ball display", Proceedings of the S.I.D., 23, 249 (1982).

Sheridon, N.K., et al., "The Gyricon–A Twisting Ball Display", Proceedings of the S.I.D., 18, 289 (1977).

Thornton, N.B., et al., "Chromophore–quencher probes for DNA", New J. Chem., 20, 791–800 (1996).

Vance, "Optical Characteristics of Electrophoretic Displays", Proceedings of the S.I.D., 18, 267 (1977).

Vaz, N.A., et al., "Dual–frequency addressing of polymer–ispersed liquid–crystal films", J. Appl. Phys., 65, 5043 (1989).

Yang, W–H, et al., "Discrete dipole approximation for calculating extinction and Raman intensities for small particles with arbitrary shapes", J. Chem. Phys. 103(5), 1995.

Yang, Y., et al., "A new architecture for polymer transistors", Nature, 372, 344 (1994).

* cited by examiner

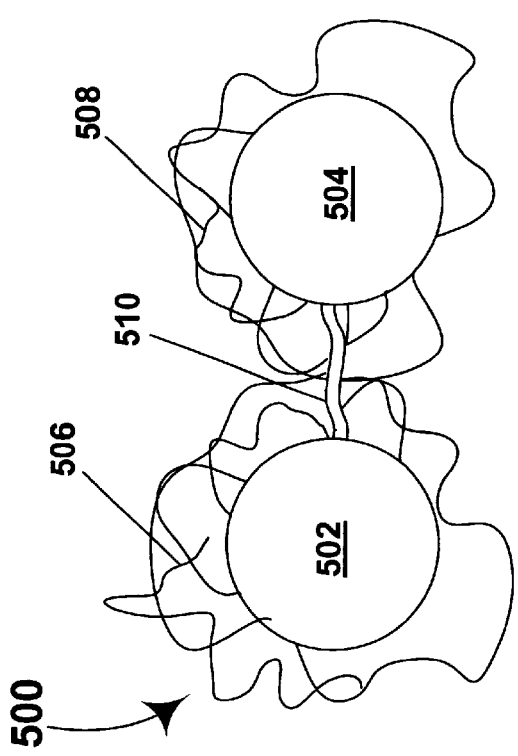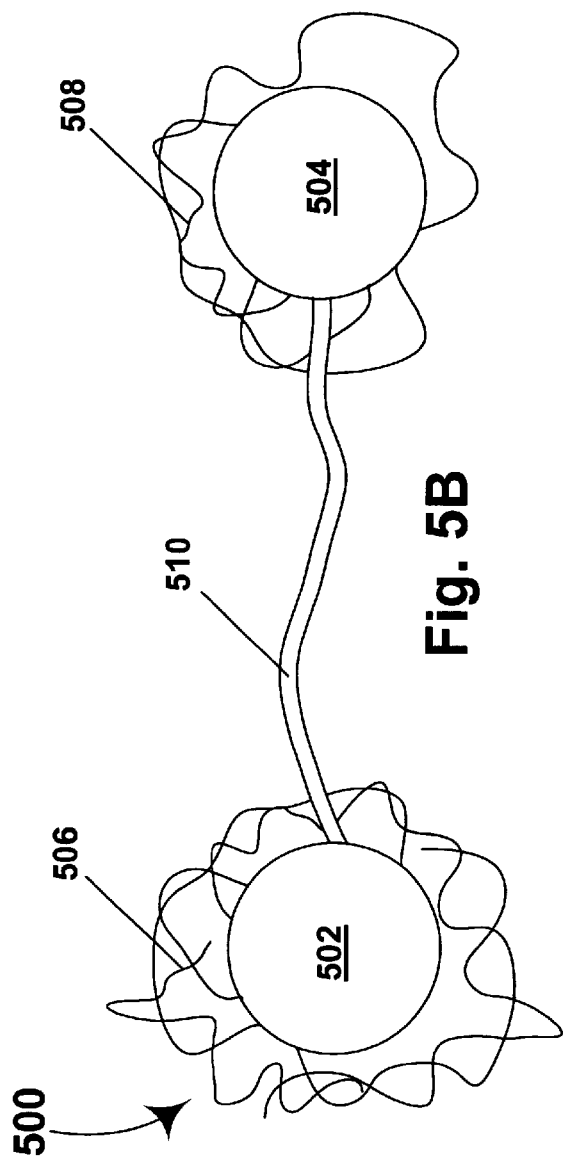

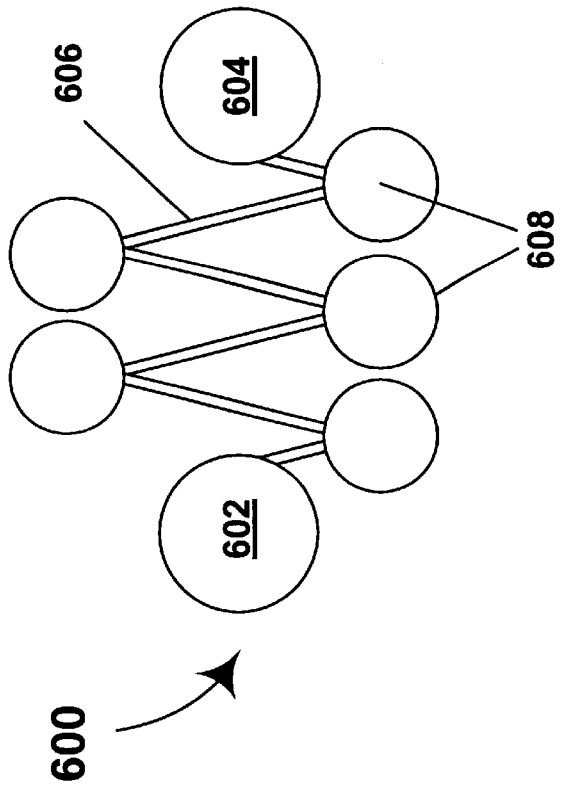
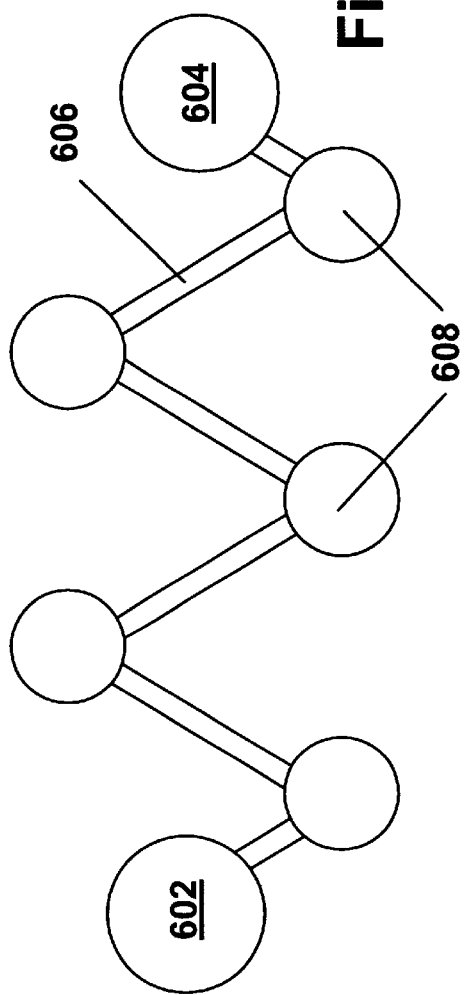

US 6,323,989 B1

ELECTROPHORETIC DISPLAYS USING NANOPARTICLES

REFERENCE TO RELATED APPLICATION

This application is a continuation-in-part of application Ser. No. 09/471,024, filed Dec. 23, 1999, which is a divisional of application Ser. No. 08/935,800, filed Sep. 23, 1997 now abandoned. The latter application claims priority from Provisional Application Ser. No. 60/035,622, filed Sep. 24, 1996, and is also a continuation-in-part of International Application No. PCT/US96/13469, filed Aug. 20, 1996, which itself claims priority from Provisional Application Ser. No. 60/022,222, filed Jul. 19, 1996. Finally, this application also claims priority from Provisional Applications Ser. Nos. 60/132,644 and 60/132,643, both filed May 5, 1999, and Provisional Application Ser. No. 60/134,245, filed May 12, 1999. The entire disclosures of all the aforementioned related applications are herein incorporated by reference.

FIELD OF THE INVENTION

The present invention relates to electrophoretic displays using nanoparticles, that is particles having diameters substantially less than the wavelengths of visible light.

BACKGROUND OF THE INVENTION

Electrophoretic displays have been the subject of intense research and development for a number of years. Such displays use a display medium comprising a plurality of electrically charged particles suspended in a fluid. Electrodes are provided adjacent the display medium so that the charged particles can be moved through the fluid by applying an electric field to the medium. In one type of such electrophoretic display, the medium comprises a single type of particle having one optical characteristic (typically a first color) in a fluid which is has a different optical characteristic (typically being dyed a different color). In a second type of such electrophoretic display, the medium contains two different types of particles differing in at least one optical characteristic and in electrophoretic mobility; the particles may or may not bear charges of opposite polarity.

Electrophoretic displays can be divided into two main types, namely unencapsulated and encapsulated displays. In an unencapsulated electrophoretic display, the electrophoretic medium is present as a bulk liquid, typically in the form of a flat film of the liquid present between two parallel, spaced electrodes. Such unencapsulated displays typically have problems with their long-term image quality which have prevented their widespread usage. For example, particles that make up such electrophoretic displays tend to cluster and settle, resulting in inadequate service-life for these displays.

An encapsulated, electrophoretic display differs from an unencapsulated display in that the particle-containing fluid is not present as a bulk liquid but instead is confined within the walls of a large number of small capsules. Encapsulated displays typically do not suffer from the clustering and settling failure mode of traditional electrophoretic devices and provides further advantages, such as the ability to print or coat the display on a wide variety of flexible and rigid substrates.

Prior art electrophoretic displays use particles, which, while small (typically about 0.25 to 2 µm), are sufficiently large that they have essentially the bulk properties of the material from which they are formed. The particles keep the same optical properties during the time they are present in the electrophoretic display; the appearance of the display is changed by moving the particles within the suspending fluid using an appropriate electrical field. For example, consider the prior art electrophoretic display represented in a schematic manner in FIG. 1 of the accompanying drawings. This display is provided on its front viewing surface (the top surface as illustrated in FIG. 1) with a common, transparent front electrode 100, and on its rear surface with an opaque substrate 102 carrying a matrix of discrete electrodes; only two of these electrodes, designated 104 and 106 respectively, are shown in FIG. 1. Each of the discrete electrodes 104 and 106 defines a pixel of the display. An encapsulated electrophoretic medium (generally designated 108) is disposed between the common electrode 100 and the discrete electrodes 104 and 106; for ease of illustration, FIG. 1 shows only a single capsule 110 of the medium 108 associated with each discrete electrode 104 and 106, although in practice a plurality of capsules (typically at least 20) would be associated with each discrete electrode. Also for ease of illustration, the capsules are shown in FIG. 1 as of circular cross-section, although in practice it is preferred that they have a flattened form.

Each of the capsules 1 10 comprises a capsule wall 112, a dark colored fluid 114 (assumed for present purposes to be blue) contained within this capsule wall 112 and a plurality of light colored charged particles 116 (assumed for present purposes to be titania particles 250–500 nm is diameter) suspended in the fluid 114. For purposes of illustration, it is assumed that the titania particles 116 are negatively charged so that they will be drawn to whichever of their associated discrete electrode and the common electrode is at the higher potential. However, the particles 116 could alternatively be positively charged. Also, the particles could be dark in color and the fluid 114 light in color so long as sufficient color contrast occurs as the particles move between the front and rear surfaces of the display medium, as shown in FIG. 1.

In the display shown in FIG. 1, each of the discrete electrodes is held at either 0 or +V (where V is a drive voltage) while the common front electrode 100 is held at an intermediate voltage +V/2. Since the titania particles 116 are negatively charged, they will be attracted to whichever of the two adjacent electrodes is at the higher potential. Thus, in FIG. 1, discrete electrode 104 is shown as being held at 0, so that the particles 116 within the adjacent capsule move adjacent the common electrode 100, and thus adjacent the top, viewing surface of the display. Accordingly, the pixel associated with discrete electrode 104 appears white, since light entering the viewing surface is strongly reflected from the titania particles adjacent this surface. On the other hand, discrete electrode 106 in FIG. 1 is shown as being held at +V, so that the particles 116 within the adjacent capsule move adjacent the electrode 106, and the color of the pixel associated with electrode 106 is that exhibited by light entering the viewing surface of the display, passing through the colored fluid 114, being reflected from the titania particles adjacent electrode 116, passing back through the colored fluid 114, and finally re-emerging from the viewing surface of the display, i.e., the associated pixel appears blue.

It should be noted that the change in the appearance of a pixel of this electrophoretic display as the voltage on the associated discrete electrode changes is solely due to the change of the position of the titania particles within the fluid; the color and other optical characteristics of the titania particles themselves do not change during operation of the electrophoretic display. In both the pixels shown in FIG. 1, the function of the titania particles is to scatter light strongly.

Obviously, the type of display shown in FIG. 1 can use particles of pigments other than titania, for example magenta pigments such as Hostaperm Pink E (Hoechst Celanese Corporation) and Lithol Scarlet (BASF), yellow pigments such as Diarylide Yellow (Dominion Color Company), cyan pigments such as Sudan Blue OS (BASF), and the like (see U.S. Pat. No. 5,364,726). However, in all cases the contribution of the pigment to the color of the display depends on the position of the pigment with respect to the viewer. When the pigment particles are adjacent the viewing surface of the display, the light scattered by the pigment is the color viewed. When the pigment is adjacent the rear surface of the display, the color is the color obtained when light passes through the fluid, is scattered from the pigment adjacent the rear surface, and then passes through the fluid again.

The single particle/color fluid type of electrophoretic display shown in FIG. 1 has two disadvantages. Firstly, the display can only produce two colors, in the manner already described, and is not capable of producing a wide range of colors. Secondly, to effect a change between the two color states, it is necessary for the titania particles to move under the electric field essentially the full distance between the two electrodes, and in practice this typically leads to a transition time between the two states of a few hundred milliseconds, and a frame rate of the order of 1 Hz, which is too slow for video applications.

Combinations of different colored pigments can be used in electrophoretic displays to form different colored images. If the different colored pigments are contained in the same volume of liquid, different colors are possible provided that the motion of each color of pigment under the influence of an electric field is different. For example, a mixture of white pigment particles positively charged and black pigment particles negatively charged could be used to make black on white or white on black images by application of appropriate electric fields.

An electrophoretic display containing only two differently colored pigments is only capable of producing a few different colors: two when either color-pigment is on the viewing side of the display, one when both pigments are on the viewing side of the display, and one when both pigments are on the back of the display. Such displays are not capable of producing a wide range of colors.

When the electrophoretic display contains just two colored pigments then the position of the colored pigments can be controlled if the colored pigments have electric charges of opposite polarity. With the electric field on with one polarity, the pigment of one color will migrate to the front of the display and the pigment of the other color will migrate to the back of the display. When the electric field is reversed, the pigments will exchange places, changing the color visible to the viewer. The time necessary to switch the color of the display is the time necessary for the pigment particles to diffuse under an applied electric field from one side of the display to the other, and is thus similar in magnitude to that of the electrophoretic display discussed above with reference to FIG. 1.

It is possible to construct an electrophoretic display composed of two different color pigments with the same polarity of charge but substantially different electrophoretic mobilities, if the electrophoretic mobility of one pigment is substantially different from that of the other. One appropriate addressing scheme is to pull all the particles to the rear of the display with the appropriate electric field. The reverse electric field is then applied only as long as it takes the more mobile of the two types of particles to reach the front viewing surface. This produces the color of the higher mobility particles. To produce the color of the lower mobility particles, all of the particles are pulled to the front of the display. Then, the field is reversed long enough that the more mobile particles are pulled away from the front electrode, leaving the lower mobility particles adjacent the front electrode. This produces the color of the lower mobility particles. The average time necessary to switch the color of the display is still at least the time necessary for the pigment particles to diffuse under an applied electric field from one side of the display to the other.

In theory, it would be possible to produce electrophoretic displays with a multitude of different colored pigments dispersed in a fluid. If each colored pigment had its own distinct electrophoretic mobility, then a range of colors could be produced in a manner similar to that just described for an electrophoretic display composed of two colored pigments with the same sign, but different magnitudes of electrophoretic mobilities. However, two obvious problems are likely to render such media containing more than three or four colors impossible to produce in practice. All pigment dispersions, even of the same chemistry, have distributions of electrophoretic mobilities arising from a distribution of particle sizes, a distribution of particle charges, and a distribution of particle shapes. In order to control the image color with a multitude of different colored pigments, the distributions of electrophoretic mobilities for each color pigment would have to be substantially separated. This is a difficult challenge. Not only would the distributions of electrophoretic mobilities have to be substantially non-overlapping when the display was manufactured, they would have to remain substantially non-overlapping for the useful life of the display. Furthermore, the switching time necessary to switch the color of the display would still be at least as great as in the electrophoretic displays discussed above.

One approach to expanding the limited range of colors available from conventional electrophoretic displays is to place an array of colored filters over the pixels of the display. For example, the display shown in FIG. 1 could be modified by changing the color of the fluid 114 to black or gray instead of blue and then placing an array of color filters (say red, green and blue) over the individual pixels of the display. Moving the titania particles adjacent the viewing surface of a pixel covered with a red filter would color that pixel red, whereas moving the titania particles of the same pixel adjacent the rear surface of the display would render the pixel dark or black. The main problem with this approach to generating color is that the color saturation is low. For example, if a red color is desired, the one-third of the pixels covered with red filters are set to appear red; whereas the two-thirds of the pixels covered with green and blue filters are set to appear dark, so that only one-third of the display surface has the desired color while two-thirds is dark, thus limiting the brightness of any color obtained.

In encapsulated electrophoretic displays another method can be used to create different colored images, namely the different colored particles can be encapsulated in different microcapsules. Microcapsules containing each of the colors can be coated on top of the appropriate addressing electrodes so that the color of choice can be displayed by moving the pigment of that color in its capsule from the back of the display to the front while all the other color pigments in their own capsules are kept at the back of the display. This design suffers from one of the same limitations as the display using color filters. When a particular color pigment is moved to the viewing surface of the display and all the other colors are moved to the back of the display, then the display surface only shows the desired color over a fraction of its surface with all the other surface showing the background color. This limits the color saturation obtainable.

Thus, a common feature of all these prior art methods to create color in electrophoretic displays is that the different colors are created primarily by controlling the position of the particles in the display, that is the color is determined by whether any particular colored pigment particles are near the viewing surface of the display or near the back of the display. Also, the time necessary to change colors is the time necessary for particles to move under the influence of an applied electric field from one side of the display to the other, and this time is typically of the order of hundreds of milliseconds.

The present invention seeks to provide electrophoretic displays which can achieve a greater variety of colors than are possible in prior art displays. The present invention also seeks to provide electrophoretic displays with reduced switching times.

SUMMARY OF THE INVENTION

Accordingly, the present invention provides an electrophoretic display comprising a fluid and a plurality of nanoparticles having diameters substantially less the wavelengths of visible light such that, when the nanoparticles are in a dispersed state and uniformly dispersed throughout the fluid, the fluid present a first optical characteristic, but when the nanoparticles are in an aggregated state in which they are gathered into aggregates substantially larger than the individual nanoparticles, the fluid presents a second optical characteristic different from the first optical characteristic, the electrophoretic display further comprising at least one electrode arranged to apply an electric field to the nanoparticle-containing fluid and thereby move the nanoparticles between their dispersed and aggregated states.

BRIEF DESCRIPTION OF THE DRAWINGS

Preferred embodiments of the invention, will now be described in more detail, though by way of illustration only, with reference to the accompanying drawings, in which:

FIGS. 5A and 5B are schematic side elevations, similar to that of FIG. 4, showing different states of a single nanoparticle unit of a fourth electrophoretic display of the invention, this unit being generally similar to that shown in FIG. 4 except that the two nanoparticles forming the unit are tethered to each other;

FIGS. 6A and 6B are schematic side elevations, similar to those of FIGS. 5A and 5B respectively, showing different states of a single unit of a fifth electrophoretic display of the invention, thus unit comprising two particles of opposing polarity and a plurality of color-forming nanoparticles all connected to a common filament;

DETAILED DESCRIPTION OF THE INVENTION

Figure 1:
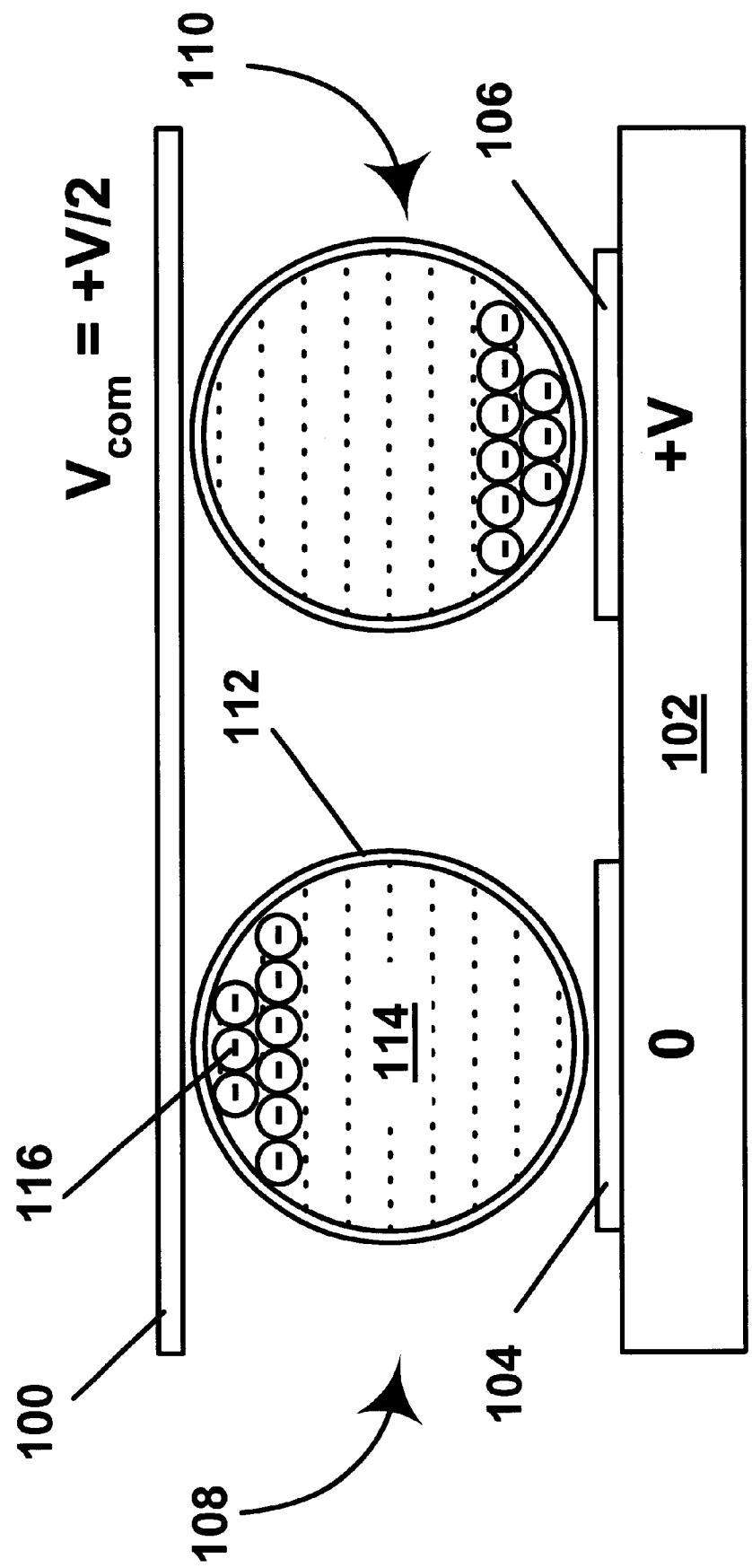
FIG. 1 is a schematic side elevation of a prior art electrophoretic display.

As already mentioned, the electrophoretic display of the present invention uses nanoparticles having diameters substantially less than the wavelengths of visible light The term "diameter" is used herein to include what is usually known as the "equivalent diameter" of a non-spherical particle, i.e., the diameter of a sphere which has the same volume as the non-spherical particle. In contrast to a conventional electrophoretic display, in which the change in the appearance of the display results from movement of the particles within the fluid, in the display of the present invention color change is brought about by changes in the state of aggregation of the nanoparticles.

Nanoparticles are distinguished from the pigment particles used in prior art electrophoretic displays by their size. Pigments particles are typically of the order of several hundred nanometers in diameter, or larger. Thus, the diameters of even the smaller pigment particles are of the same order as the wavelengths of visible light, which vary from about 400 nm for blue light to about 700 nm for red light. It is well known to those skilled in optics that the light scattering power of particles is approximately proportional to the sixth power of the particle diameter for particles having diameters less than the wavelength of the relevant light. Thus, isolated nanoparticles much smaller than the wavelength of light do not appreciably scatter the light and, as such, are effectively transparent. However, the same nanoparticles, when brought into proximity with one another and thus aggregated into larger clusters having diameters comparable to the wavelength of light, scatter light strongly. Thus, by controlling whether the nanoparticles are dispersed or aggregated (into larger isolated particles or into a layer), one can determine whether the nanoparticles appear transparent or turbid, and thus the color of an electrophoretic display can be changed by controlling the degree of aggregation of the nanoparticles.

The upper limit on the size of the nanoparticles which are useful in the present invention will vary somewhat depending upon the nature of the material forming the nanoparticles and the fluid in which they are dispersed; in particular, the light scattering by dispersed nanoparticles depends upon both the size of the nanoparticles themselves and the ratio of the refractive index of the nanoparticles to that of the suspending fluid. Titania has a high refractive index, so that when titania is used as a nanoparticle in a fluid, such as a hydrocarbon fluid, of relatively low refractive index, the titania particles should not exceed about 100 nm in diameter, and preferably do not exceed about 50 nm. Other nanoparticles formed from materials of lower refractive index, for example zinc oxide (refractive index about 2.0), clays and magnesium silicate (both about 1.6) can be larger (up to about 200 um) and still not scatter light to any substantial extent. However, in general it is preferred to keep the size of the nanoparticles below about 50 nm.

The material used to form the nanoparticles can be an insulator, a conductor or a semiconductor. Examples of suitable insulators include the titania, zinc oxide, clays and magnesium silicate already mentioned. Organic insulators could also be used, although such organic materials will typically require thicker layers to achieve good light scattering than do the inorganic insulators already mentioned. Examples of suitable conductors include most metals, especially silver and gold. An example of a suitable semiconductor is cadmium selenide.

Although nanoparticles formed from insulators, conductors and semiconductors can all be used in the electrophoretic display of the present invention, the changes in optical characteristics of the electrophoretic medium as the particles move between their dispersed and aggregated states do differ in the three cases. In the case of nanoparticles formed from insulators, as already indicated aggregation of the particles causes a change in efficiency of light scattering in accordance with the predictions of Rayleigh's theory of light scattering. Thus, in this case the first optical characteristic (when the nanoparticles are in their dispersed state) is a low level of light scattering, and the second optical characteristic (when the nanoparticles are in their aggregated state) is a substantially increased level of light scattering.

Conducting nanoparticles, such as silver or gold nanoparticles, also change color with aggregation. This color change is due to the change in the average refractive index as the aggregates form, as described by the theory of plasmon resonance. In contrast to the case of nanoparticles formed from insulators (where aggregation increases the intensity of light scattering increases but the nanoparticle color remains substantially the same), when nanoparticles formed from electrical conductors aggregate both the color and the intensity of light scattering increases (i.e., the first and second optical characteristics of the display comprise different colors). For example dispersions of gold nanoparticles are typically ruby red. Aggregates of gold nanoparticles vary in color from purple to blue to black depending on the interparticle distance (U. Kreibig et al., Surf. Sci., 156, 678–800, 1985 and W-H Yang et al., J. Chem. Phys. 103(5), 1995). Therefore the color of an electrophoretic display can be controlled by controlling the degree of aggregation of nanoparticles of conductors such as gold.

Nanoparticles of semiconductors have strong particle size dependent colors in both the dispersed and aggregated states. The colors are best and most easily seen in fluorescence, and are due to the size dependent quantization of electronic levels in the nanoparticles. The smaller the particles, the larger the band gap and the shorter the wavelength of the fluorescence. Examples of such nanoparticles of semiconducting materials are cadmium selenides (see, for example, M. G. Bawendi, Solid State Comm., 107(11), 709 (1998)). These particles have fluorescent peaks that vary smoothly from 400 nm (blue) to 700 nm (red) as the nanoparticle size varies from about 1.2 nm to 11.5 nm (C. B. Murray et al., JACS, 115(19), 8709 (1993)).

When semiconductor nanoparticles such as cadmium selenides are synthesized, the surfaces of the particles are generally treated with organic layers such as a trialkylphosphine or trialkylphosphine oxide. The presence of this surface treatment provides a barrier to flocculation of the nanoparticles so that the dispersion of the nanoparticles is colloidally stable and the particles stay uniformly distributed in the fluid for an extended period. Typically these nanoparticles dispersions are nearly monodisperse. This leads to pure colors. Mixtures of monodisperse semiconducting nanoparticles of different sizes produce fluorescent colors that are approximately the weighted averages of the monodisperse dispersions.

When monodisperse dispersions of semiconducting nanoparticles are aggregated into dense phases the organic surface layers prevent particles from coming into intimate contact. Therefore the aggregation does not change the intensity of the fluorescence color. However, when differently sized semiconducting nanoparticles are aggregated, the color changes to substantially that of the larger particle, that is the longer wavelength color. This is explained by the long range exchange of fluorescent light from the higher energy fluorescence in the smaller particles to the lower energy fluorescence in the larger particles. Therefore aggregation of semiconducting nanoparticles of different wavelengths produces a change in color (C. R. Kagan et al., Phys. Rev. Lett, 76(9), 1517–1520 (1996)).

Other optical effects can be achieved by a combination of fluorescing nanoparticles of semiconductors and nanoparticles of insulators. For example the aggregation of titania nanoparticles (insulators) with semiconducting cadmium sulfide nanoparticles (semiconductors) decreases the fluorescence of the semiconducting particles by the quenching of the fluorescent state by the insulating particles (H. Matsumoto et al., Langrnuir, 11, 4283–4287 (1995)).

The use of surface treatment of the nanoparticles to prevent unwanted aggregation of such particles in their dispersed state is of course not confined to semiconductor nanoparticles, nor is it confined to the specific surface treating agents already mentioned. For example, gold nanoparticles could be stabilized by a polymeric coating, thereby enabling two sets of gold nanoparticles bearing charges of opposite polarity to be dispersed in a hydrocarbon solvent to form an electrophoretic display of the present invention, as described in more detail below. In such a case, the gold nanoparticles might typically be about 10 nm in diameter and the polymeric coating might have a thickness of about 10 nm. Titania or other insulator nanoparticles could be provided with polymeric or other coatings for similar purposes. Coating or chemical treatment of the surfaces of the nanoparticles can also be used to adjust the electrophoretic mobility of the nanoparticles.

As already indicated, in the electrophoretic display of the present invention, the electrophoretic medium may or may not be encapsulated, although it is generally preferred that the medium be encapsulated for reasons previously discussed. An encapsulated medium may conveniently have a plurality of microcapsules having diameters in the range of from about 10 to about 500 $\mu$m. Encapsulated media are also convenient for application to a variety of substrates, including flexible substrates, by printing techniques.

Use of the word "printing" is intended to include all forms of printing and coating, including, but without limitation: pre-metered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; and other similar techniques. Thus, the resulting display can be flexible. Further, because the display media can be printed (using a variety of methods), the display itself can be made inexpensively.

The suspending fluid used in the present invention is desirably a high resistivity fluid, and may or may not be colored depending upon the exact type of system used; the color could take the form of conventional large (i.e., not nanoparticle-sized) pigment particles suspended in the fluid, although a dye dissolved in the fluid is typically more convenient. The suspending fluid may be a single fluid, or it may be a mixture of two or more fluids. The suspending fluid may have its density substantially matched to that of the particles within the capsule. The suspending fluid may be a halogenated hydrocarbon, such as tetrachloroethylene, for example. The halogenated hydrocarbon may also be a low molecular weight polymer. One such low molecular weight polymer is poly(chlorotrifluoroethylene). The degree of polymerization for this polymer may be from about 2 to about 10.

As will be apparent to those skilled in art of electrophoretic displays, it is necessary to provide two electrodes adjacent the electrophoretic medium in order to apply the necessary electric field to the medium. However, only one electrode need be a permanent feature of the present display; the second electrode could have the form of a hand-held stylus or similar device which is brought near the medium only where it is desired to change the state of the medium. More often, however, the present electrophoretic display will have at least two permanent electrodes. These electrodes may be disposed upon opposed sides of the nanoparticle-containing fluid, in which case at least one of the electrodes should be substantially transparent to provide a viewing surface through which the nanoparticle-containing fluid can be viewed. Alternatively, both electrodes can be disposed on the same side of the nanoparticle-containing fluid so that the opposed side of the nanoparticle-containing fluid constitutes a viewing surface through which the nanoparticle-containing fluid can be viewed. Having both electrodes on the display facilitates forming an all-printed device. Especially when both electrodes are present on the same side of the electrophoretic medium, the two electrodes may differ in size to permit the nanoparticles to be aggregated in regions of differing size (cf., for example, International Patent Application Publication No. WO 99/10768, assigned to the same assignee as the present application, FIGS. 1A–1C, 2A–2D and 3A–3D, and the related description on pages 9–15 of this publication).

As will be apparent from the foregoing description, the present invention encompasses several different methods for changing the state of aggregation of the nanoparticles. These methods include:

1. Forming aggregates from multiple dispersed nanoparticles;
2. Separating aggregates of oppositely-charged particles under the influence of an electric field;
3. Forming units each comprising a plurality of nanoparticles attached to a single substrate such that, upon application of an electric field to the units, the distances between the nanoparticles within the unit will change, thereby changing the optical characteristic displayed by the unit; and
4. Attaching charged nanoparticles to a fixed body via a flexible filament such that, upon application of an electric field to the nanoparticles, the spacing between the nanoparticles and the fixed body will vary.

(The foregoing list of methods is not intended to be exclusive and other methods of causing changes in the aggregation of nanoparticles could be used. For example, the electric field could bring about a change in pH, or generate a particular ion, which could affect the conformation of a polymer in a manner similar to that discussed below with reference to FIGS. 6A, 6B, 7 and 8.)

Method 1 has already been discussed. An example of Method 2 would be forming a sol of two different types of gold particles (typically polymer-coated) bearing opposite charges. In the absence of an electric field, the two types of particles will form pairs comprising one particle of each type. If, however, a strong electric field is applied to the fluid, the particles in each pair will be forced apart, thereby changing the effective size of the gold particle and bringing about a color change in the manner already discussed.

Several variations of both Methods 3 and 4 possible. For example, in Method 3, each unit might comprise two or more nanoparticles connected by a flexible filament. Alternatively, the unit might comprise an elongate flexible filament having one end attached to a fixed body and having an electrically charged body affixed at or adjacent its opposed end, the filament having a plurality of nanoparticles fixed thereto at spaced intervals between the fixed body and the electrically charged body, such that upon application of an electric field to the unit, the spacing between the fixed body and the electrically charged body will change, thereby changing the distances between the nanoparticles. The unit may also comprise an elongate flexible filament having one end attached to a first electrically charged body and its opposed end attached to a second electrically charged body bearing a charge of opposite polarity to the first electrically charged body, the filament having a plurality of nanoparticles fixed thereto at spaced intervals between the two electrically charged bodies, such that upon application of an electric field to the unit, the spacing between the two electrically charged bodies will change, thereby changing the distances between the nanoparticles.

An example of Method 4 would be a system in which at least some of the nanoparticles bear an electrical charge and are attached via flexible filaments to a fixed body, such that upon application of an electrical field to the nanoparticles the spacing between the nanoparticles and the fixed body will vary. If a large number of nanoparticles are tethered to a single fixed body in this way, changes in the applied electrical field will cause changes in the degree of "close-packing" of the nanoparticles, and hence color or light scattering changes in the manner already described.

The following considerations are applicable to the various applications of Methods 3 and 4. The use of a substrate to which the nanoparticles are physically attached assists in controlling the spacing between the nanoparticles. For example, as already mentioned, for conducting nanoparticles, control of color depends on forming pairs or perhaps triplets, or on forming aggregates with a controlled interparticle distance. For semiconducting nanoparticles, control of color can be obtained if pairs of differently sized particles are formed. These goals may be accomplished by tethering the particles with polymers of controlled length. This idea has been shown to be effective with chromophore-quencher probes for DNA (N. B. Thorton et al., New J. Chem., 20, 791–800 (1996)).

Tethering particles of different sizes to each other is an aid to forcing the proper kinds of interparticle interactions to occur, say, that between an semiconducting particle and an insulating particle. Even better control of the interparticle spacing is obtained when the particles that are tethered to each other have electric charges. Particles with opposite electric charges can be separated by the application of an electric field. In the absence of an electric field, oppositely charged particles are drawn towards each other. The color of the pair will change depending on the interparticle distance and the interparticle distance can be controlled by a combination of proper polymer tether and application of an electric field.

An advantage of this tethered particle strategy is that the particles need only move a small distance, say on the order of a few particle diameters in order for the color to change. This small distance can be traversed quickly so that switching time of the display can be reduced substantially as compared with that of the prior art electrophoretic displays discussed above.

Nanoparticles tethered to a wall or other fixed object with a polymer can form small clusters when the electrical attraction between oppositely charged nanoparticles causes aggregation. With nanoparticles in a thin layer, the size of the clusters would be quite small, generally of the order of pairs. The application of an electric field would change the interparticle distances and hence the color of the display. Such nanoparticles tethered to a wall could be used in conventional unencapsulated electrophoretic displays; in encapsulated electrophoretic displays, the particles could alternatively be tethered to the capsule walls. Not only would the relevant color changes be fast since the particles need only move short distances before the color changes, the displays could be made relatively thin.

The tethering may be one nanoparticle to one nanoparticle, the particles being of opposite electric charge and different size or composition. The tethering could be many to one with many particles of one composition or of small size attached to a larger particle of the same composition (as in fluorescing nanoparticles of cadmium selenide).

The tethering could alternatively be that of many particles attached to a single polymer chain. Numerous uncharged nanoparticles could be attached to a polymer chain with a pair of oppositely charged particles (which need not be color producing) attached to the same chain in order to extend the chain and increase interparticle distance with the application of an electric field.

In a further embodiment of the invention, nanoparticles, all with the same sign charge could be tethered to an electrode. Application of an electric field forces the nanoparticles closer together or close to the electrode or both. Any of these changes in interparticle distance could change the color of the layer. Nanoparticles could be tethered to an electrode with polymers of a wide range of molecular weights. This "sea" of tethered nanoparticles could be forced into smaller interparticle spacing with the application of an electric field. Various magnitudes of electric field could produce different interparticle spacings and hence different colors, particularly gray scales.

One interesting embodiment of this type would have two sets of nanoparticles of opposite charge tethered to one side of the electrophoretic medium and have two sets of electrodes on the same side of the medium, the two sets of electrodes being interleaved (interdigitated). Application of opposing polarities to the two sets of electrodes would separate the two sets of particles, thus changing the appearance of the display. Such a display could be made extremely thin and could have a very short switching time.

The substrates and filaments used in the methods just described will typically be polymer chains. In the following description, such polymer chains will typically be described as if each nanoparticle is attached to a single polymer chain. However, in view of what has been said above, it will be appreciated that the important point for the functioning of the present electrophoretic displays is that strength of the relevant particle-particle or particle-electric field interactions are sufficient to vary the interparticle spacing so as to cause color changes. Accordingly, for practical purposes, it is irrelevant whether one or a plurality of polymer chains are used to link the nanoparticles together, and the latter may be preferred.

The polymers used to tether nanoparticles to each other need to be firmly anchored to each particle. Preferably, this firm anchoring is effected by chemical grafting of the polymer chain to the nanoparticle surface with one or more chemical bonds. However, the necessary anchoring may in some cases be achieved by acid-base interactions, by physical adsorption forces, by solvation forces or by any combination of these forces provided the strength of the resultant anchoring is sufficient to withstand any disruption to which it is subject due to applied electric fields and/or viscous forces as the nanoparticles move through the fluid.

As already mentioned, polymers grafted to the nanoparticle surface are most firmly held. Polymers that can bind to the nanoparticle surface via multiple attachment sites are usually more firmly held than polymers having only a single attachment site. The attachment of the polymer can be by chelation of active groups on the polymer to ions or other attachment sites on the nanoparticle surface. The attachment can also be by electrostatic forces.

An important property of the polymers is their elasticity. The polymer must be sufficiently flexible to permit close nanoparticle-nanoparticle approach in one display state and yet allow large nanoparticle-nanoparticle separations to achieve a second display state upon the application of an electric field. The elasticity of polymers varies with the chemistry of the polymer and with the interaction between the polymer and the fluid in which it is immersed. In general, when the polymer interactions with the fluid are weak, the polymer tends to collapse in upon itself; on the other hand, when the polymer-fluid interactions are stronger, the polymer tends to assume a longer, more extended from. Thus, the separation between nanoparticles can be changed not only by the application of electric forces but by changes in polymer/fluid solvation forces.

Such solvation forces can be varied by changing the composition of the fluid, for example by the addition or removal of a component which is a non-solvent for the polymer. Solvation forces can also be changed by the addition of species that modify the polymer itself, such as acids and bases. Solvation forces also change with temperature.

The electrophoretic display of the present invention can operate in either a transmissive or a reflective mode. For example, if the electrophoretic medium is of the type previously described using insulating nanoparticles when are essentially non-light-scattering in their disperse state (so that the medium is substantially transparent) but light-scattering in the aggregated state (so that the medium is substantially opaque), the electrophoretic display may have a viewing surface through which the nanoparticle-containing fluid can be viewed, and on the opposed side of the display from the viewing surface, a light source arranged to pass light through the nanoparticle-containing fluid. The electrophoretic medium can thus act as a light valve, or as a privacy window; a microencapsulated electrophoretic medium of this type could be used to print large area privacy windows at relatively low cost per unit area.

Alternatively, using the same type of light-scattering/non-light-scattering electrophoretic medium, the surface of the display opposite the viewing surface could be reflective or colored. When the medium is in its non-light-scattering (transparent) state, an observer looking at the viewing surface will see the reflective or colored rear surface of the display, whereas when the medium is in light-scattering mode, the observer will see the color of the medium itself, the reflective or colored rear surface being obscured. The reflective surface used in this type of display may be, for example, a specular mirror, a textured gain reflector, a holographic reflector or a diffraction grating. Particularly when used with directional lighting, a large contrast can be obtained between the two states of the display. If the rear surface of such a display is patterned with differing colors, multiple color or full color displays can be achieved.

Figure 2A:
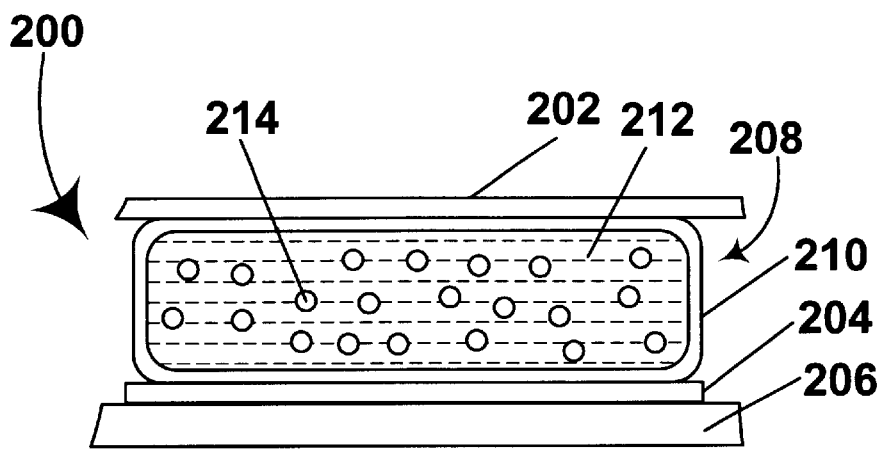
FIGS. 2A–2C are schematic side elevations showing various states of a first electrophoretic display of the present invention comprising a single type of nanoparticle in a colored fluid.

FIG. 2A of the accompanying drawings is a schematic side elevation, generally similar to that of FIG. 1, of an encapsulated electrophoretic display (generally designated 200) of the present invention having a single type of charged nanoparticle (assumed for present purposes to be negatively-charged, though obviously a positively-charged nanoparticle could equally well be used) dispersed in a colored fluid. FIG. 2A shows only a single pixel of the display, and for the same reasons as in FIG. 1, shows only a single microcapsule forming this pixel, although in practice a large number of microcapsules (20 or more) would be used for each pixel.

The electrophoretic display 200 comprises a common, transparent front electrode 202 which forms the viewing surface through which an observer views the display, and a plurality of discrete rear electrodes 204, each of which defines one pixel of the display (only one electrode 204 is shown in FIG. 2A). The rear electrodes 204 are mounted upon a substrate 206. The rear electrodes 204 preferably have a highly reflective upper surface (as shown in FIG. 2A); alternatively, the rear electrodes 204 may be transparent and the substrate 206 be provided with a highly reflective upper surface.

The electrophoretic display 200 further comprises an encapsulated electrophoretic medium comprising microcapsules 208 having microcapsule walls 210 encapsulating a dyed liquid 212. A plurality of nanoparticles 214 are uniformly dispersed throughout the liquid 212. In a preferred form of this electrophoretic display, the nanoparticles 214 comprise titania particles, negatively charged and having a diameter of about 10 nm, while the liquid 212 comprises a hydrocarbon having dissolved therein a blue dye.

FIG. 2A shows the display 200 in its condition when no field is applied across the electrodes 202 and 204. Since the nanoparticles 214 are not subject to any applied field, they remain uniformly dispersed throughout the liquid 212 and, since they are substantially smaller in diameter than the wavelengths of visible light, the nanoparticles are essentially non-light-scattering and appear transparent. Accordingly, an observer viewing the display from above (in FIG. 2A) sees the color caused by light passing through the dyed liquid 212, reflecting from the rear electrode 204 (or substrate 206 depending upon which integer bears the reflective surface), and passing back through the dyed liquid 212.

Figure 2B:
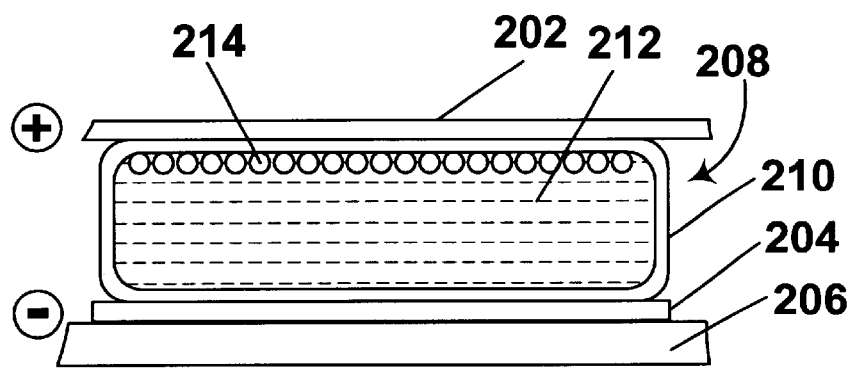

FIG. 2B shows the state of the same electrophoretic display 200 when a positive potential is applied to the front electrode 202 and a negative potential to the rear electrode 204. The resultant electric field causes the nanoparticles 214 to aggregate adjacent the front electrode 202, so that the observer sees the color of the aggregated nanoparticles 214 (white in the case of the preferred titania nanoparticles).

Figure 2C:
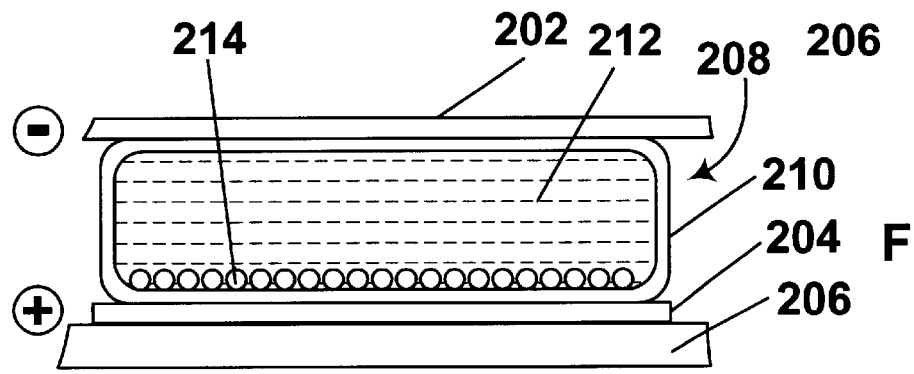

FIG. 2C shows the state of the same electrophoretic display 200 when a negative potential is applied to the front electrode 202 and a positive potential to the rear electrode 204. The resultant electric field causes the nanoparticles 214 to aggregate adjacent the rear electrode 204, so that the observer sees the color caused by light passing through the dyed liquid 212, scattering from the aggregated particles 214, and passing back through the dyed liquid 212. Note that this color is not the same as that produced in FIG. 2A, where reflection occurs from the rear electrode 204 or substrate 206. Thus, the display 200 shown in FIGS. 2A–2C is capable of displaying three different colors, in contrast to a similar display using conventional large pigment particles in place of the nanoparticles 214; in effect, the conventional display using large pigment particles lacks any state comparable to that shown in FIG. 2A, in which the nanoparticles are in a non-light-scattering dispersed condition and effectively "disappear" from the display.

The display 200 shown in FIGS. 2A–2C may be modified by replacing the reflective surface on the rear electrode 204 or substrate 206 with a black, non-reflective surface. In the condition shown in FIG. 2A, the observer then sees the black color of the rear surface, thus providing three completely different colors depending upon the state of the display.

As already indicated, the display 200 can be changed from the condition shown in FIG. 2A to that shown in FIG. 2B or 2C by applying the appropriate direct current electric field. The reverse change is conveniently effected by applying, via the electrodes 204 and 206, an alternating current field of a sufficient frequency, which is typically of the order of tens of Hertz or higher. Alternatively a pulsed direct current field may be used to disperse the nanoparticles.

It will be seen that, in the state shown in FIG. 2B, the nanoparticles effectively form a single flat layer adjacent the electrode 202. At least in theory, if the single layer of microcapsules 208 shown in FIGS. 2A–2C were replaced by multiple layers of very small microcapsules having the same thickness, this thickness being of the same order as the wavelengths of visible light, in the state corresponding to that of FIG. 2B, the nanoparticles would form a series of flat, parallel planes spaced by regular spacings of the same order as the wavelengths of visible light. Such a structure could serve as a diffraction grating.

Figure 3A:
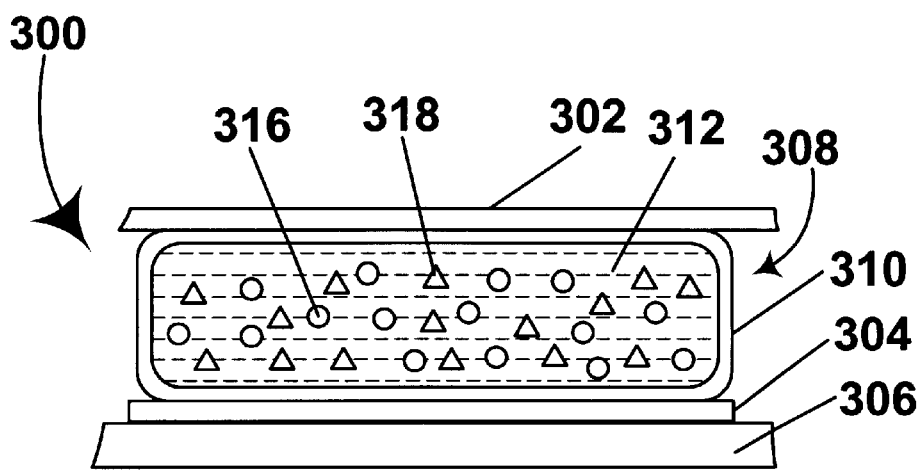
FIGS. 3A–3C are schematic side elevations, similar to those of FIGS. 2A–2C respectively, showing various states of a second electrophoretic display of the present invention comprising two types of nanoparticle in a colored fluid.

FIG. 3A shows an electrophoretic display (generally designated 300) of the present invention which uses microcapsules 308 comprising two different types of nanoparticles 316 and 318 having charges of the same polarity (assumed for present purposes to be negative) but different electrophoretic mobilities, the mobility of nanoparticles 316 being highly than that of nanoparticles 318. The nanoparticles 316 and 318 also differ in color when aggregated; for example, the nanoparticles 316 could be red when aggregated and the nanoparticles 318 blue. Also, the fluid 312 in the microcapsules 308 is uncolored, and the rear electrode 304 is colored with a color (say green) which differs from the colors of both the aggregated nanoparticles 316 and 318; alternatively, the rear electrode 304 could be transparent and the green color provided on the substrate 306.

In the condition shown in FIG. 3A, no field is applied across the electrodes 302 and 304. Since the nanoparticles 316 and 318 are not subject to any applied field, they remain uniformly dispersed throughout the liquid 312 and, since they are substantially smaller in diameter than the wavelengths of visible light, the nanoparticles are essentially non-light-scattering and appear transparent. Accordingly, an observer viewing the display from above (in FIG. 3A) sees the color (green) of the rear electrode 304.

Figure 3B:
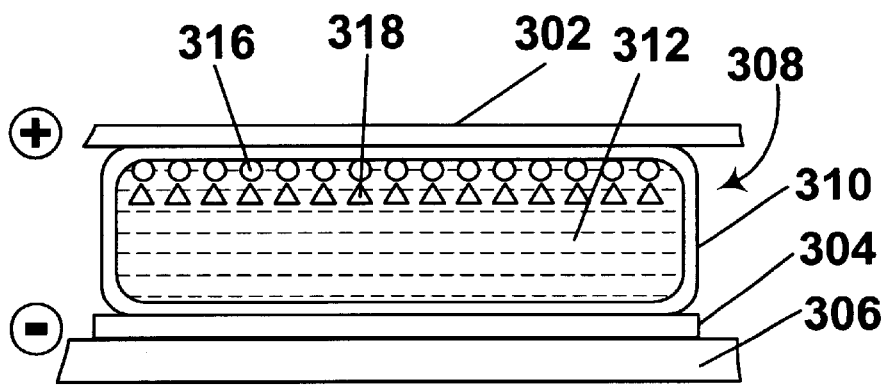

FIG. 3B shows the state of the same electrophoretic display 300 when a positive potential is applied to the front electrode 302 and a negative potential to the rear electrode 304. The resultant electric field causes the nanoparticles 316 and 318 to aggregate adjacent the front electrode 302, but since the nanoparticles 316 have the higher electrophoretic mobility, they will reach the electrode 302 first and the observer will see the color (red) of the aggregated nanoparticles 316.

Figure 3C:
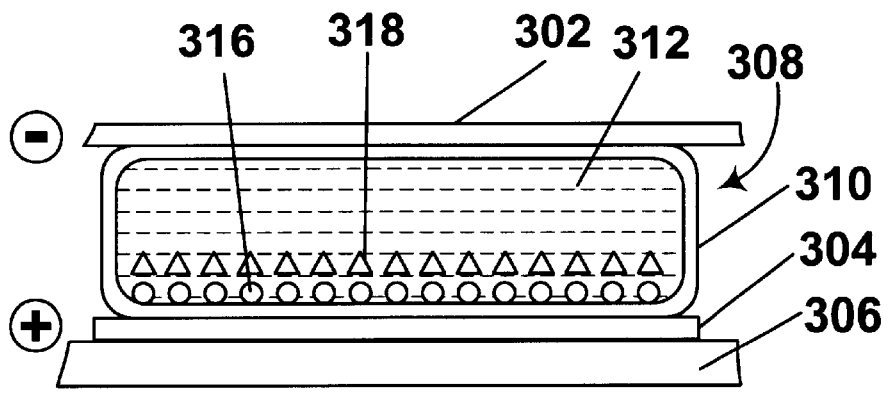

FIG. 3C shows the state of the same electrophoretic display 300 when a negative potential is applied to the front electrode 302 and a positive potential to the rear electrode 304. The resultant electric field causes the nanoparticles 316 and 318 to aggregate adjacent the rear electrode 304, but since the nanoparticles 316 have the higher electrophoretic mobility, they will reach the electrode 304 first, leaving a layer of aggregated nanoparticles 318 facing the front electrode 302 so that the observer sees the color (blue) of this later of aggregated nanoparticles 318. Thus, each pixel of the display 300 is capable of displaying a red, green or blue color, and thus the color saturation obtainable from such a display is markedly greater than that from a conventional electrophoretic display using filters, as discussed above.

The display shown in FIGS. 3A–3C may be modified by replacing the colored rear surface on the electrode 304 or substrate 306 with a reflective surface and by incorporating a dye into the liquid 312. When this modified display is in the condition shown in FIG. 3A, the color seen by the observer is that resulting from light passing through the dyed liquid 312, reflecting from the rear electrode 304 and passing back through the dyed liquid 312, i.e., the observer sees simply the color of the dyed liquid.

As with the display 200, the display 300 can be changed from the condition shown in FIG. 3A to that shown in FIG. 3B or 3C by applying the appropriate direct current electric field. The reverse change is conveniently effected by applying, via the electrodes 304 and 306, an alternating current field of a sufficient frequency, which is typically of the order of tens of Hertz or higher. Alternatively a pulsed direct current field may be used to disperse the nanoparticles.

The fact that the types of displays shown in FIGS. 2A–2C and 3A–3C possess a state (shown in FIGS. 2A and 3A) in which the microcapsules are transparent (providing the suspending fluid is not colored) allows one to use multiple superimposed layers of microcapsules to achieve more than three colors in each pixel. As is well known to those skilled in the imaging art, to achieve realistic full color images one must be able to control not only the color of each area of the image, but also the saturation of the color, and to do so one needs to be able to set various pixels not only to the three primary colors being used but also to black or white; note that conventional four-color CMYK printing on paper is in a reality a five-color system, the white color normally being supplied by unprinted areas of the white paper. A comparable five-color system can be achieved using a "double-stacked" modification of the display shown in FIGS. 3A–3C, in which an additional layer of microcapsules and an additional layer of discrete, transparent electrodes similar to the discrete electrodes 304 are placed above the continuous electrode 302. (For reasons which will readily be apparent to those skilled in electrical driving of displays, only one continuous electrode and two sets of discrete electrodes are required to achieve independent driving of each pixel in each of the two layers of microcapsules; there is no need for a second continuous electrode.) If the three states of each upper microcapsule are (say) transparent, red and blue, and the three states of each lower microcapsule are green, black and white, any given pixel of the display can be set independently to any of the five colors, thereby producing a color display capable of achieving controlled color saturation as well as full color.

To change the display 200 or 300 from one colored image to another, it is convenient to apply the alternating field to all the pixels of the display, thereby restoring all pixels to the condition shown in FIG. 2A or 3A, and then the change the desired pixels as needed to display the new image. Note that the transitions 2A→2B and 2A→2C (and the analogous transitions for the display 300) can conveniently be effected simultaneously using a so-called "V/2" technique, in which the front electrode 202 is set to a voltage of +V/2, while the various electrodes 204 controlling the individual pixels are set to 0, +V/2 or +V, depending upon the desired state of the associated pixel.

Figure 4:
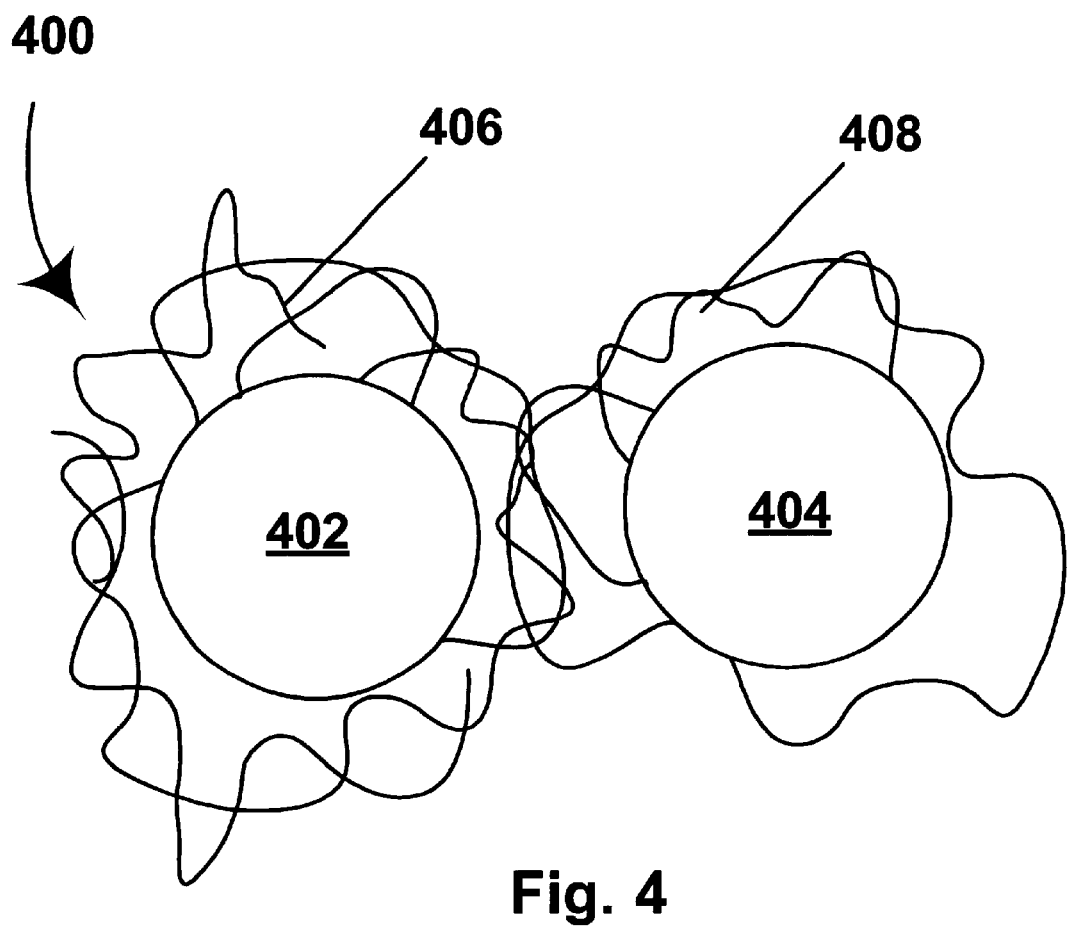
FIG. 4 is a schematic side elevation of a single nanoparticle of a third electrophoretic display of the invention, this nanoparticle being formed from two coated nanoparticles having charges of opposite polarity.

FIG. 4 shows a single nanoparticle (generally designated 400) of a third electrophoretic display of the present invention. This nanoparticle 400 is composed to two separate gold nanoparticles 402 and 404, each of which bears a polymer coating 406 or 408 respectively. The nanoparticle 402 is positively charged, while the nanoparticle 404 is negatively charged, so that when no field is applied to the nanoparticles 402 and 404, they are held together by electrostatic attraction to form the combined nanoparticle 400. However, when a strong field is applied to the nanoparticle 400, the nanoparticles 402 and 404 will separate under the influence of this field. For reasons discussed above, the color of gold nanoparticles varies with the size of the particle, and hence the separation of nanoparticles 402 and 404 will change the color of the display.

FIGS. 5A and 5B show two different states (no electric field in FIG. 5A, and a strong direct current field in FIG. 5B) of a single nanoparticle unit (generally designated 500) which is generally similar to that shown in FIG. 4 in that it comprises two gold nanoparticles 502 and 504 each of which bears a polymer coating 506 or 508 respectively, the nanoparticle 502 being positively charged, while the nanoparticle 504 is negatively charged. However, in contrast to the display shown in FIG. 4, the nanoparticles 502 and 504 are attached to opposed ends of a polymeric filament 510 having a length equal to several times the diameter of each of the nanoparticles 502 and 504. Accordingly, when no field is applied to the unit, as shown in FIG. 5A, the nanoparticles 502 and 504 are held together by electrostatic attraction to form the combined nanoparticle 500. However, when a strong field is applied to the nanoparticle 500, as shown in FIG. 5B, the nanoparticles 502 and 504 will separate under the influence of this field to the extent allowed by the polymeric filament 510.

This filament is made long enough that the nanoparticles are separated by a distance sufficient to isolate them from one another so that the color of the display, in the state shown in FIG. 5B, is that associated with the isolated nanoparticles 502 and 504. However, when the field is removed, the nanoparticles 502 and 504 will rapidly reassociate to form the combined nanoparticle 500.

It will be seen that the displays shown in FIGS. 4, 5A and 5B, especially that shown in FIGS. 5A and 5B, are capable of very rapid switching, since the color change only requires that the individual nanoparticles move relative to each other by a few nanoparticle diameters (a distance typically about 50–100 nm), in contrast to conventional displays which require the electrophoretic particles to move a distance approximately equal to the thickness of the medium, which is typically about 250 $\mu$m, or 250,000 nm. Thus, the displays just described should reduce switching times by at least two orders of magnitude as compared with conventional electrophoretic displays, thereby rendering the displays of the present invention suitable for use in video applications.

FIGS. 6A and 6B show two different states (no electric field in FIG. 6A, and a strong direct current field in FIG. 6B) of a single unit (generally designated 600) of a fifth electrophoretic display of the present invention. The unit 600 comprises two particles 602 and 604 attached to opposed ends of a filament 606. The particles 602 and 604 need not be nanoparticles and need not be color-forming; indeed, to allow maximum flexibility in the design of this type of display, it is generally preferred that the particles 602 and 604 be neither colored nor color-forming. The particles 602 and 604 bear charges of opposite polarity, particle 602 being positively charged and particle 604 negatively charged. The filament 606 is chosen to be of a type (for example, one or more polypeptide chains) which, in the absence of external forces, naturally assumes a helical or similar configuration; those skilled in the art will appreciate that the conformation of many polymers is strongly dependent upon the type of liquid in which they are immersed, and accordingly that in forming the type of display presently being described, both the filament 606 and the suspension liquid must be carefully chosen to produce the desired conformation of filament 606. A plurality of nanoparticles 608 are attached at intervals along the filament 606. In the state shown in FIG. 6A, in which no external electric field is applied, the electrostatic attraction between the particles 602 and 604, together with the natural helical conformation of the filament 606, results in the unit 600 assuming a compact configuration in which the various nanoparticles 608 contact or lie closely adjacent one another, so that the color of the unit is that of the aggregated nanoparticles 608. However, when a strong direct current electric field is applied to the unit, as shown in FIG. 6B, the particles 602 and 604 are drawn apart by the electric field and the filament 606 assumes an extended, substantial linear configuration, in which the nanoparticles 608 are separated from each other, so that the color displayed by the unit 600 is that of the dispersed nanoparticles 608. For reasons similar to those discussed above with reference to FIGS. 4, 5A and 5B, the display shown in FIGS. 6A and 6B is capable of very rapid switching. It should also be noted that, by varying the strength of the electric field, the unit 600 could be made to assume conformations intermediate those shown in FIGS. 6A and 6B, thus rendering the display capable of achieving multi-level gray scale.

Figure 7:
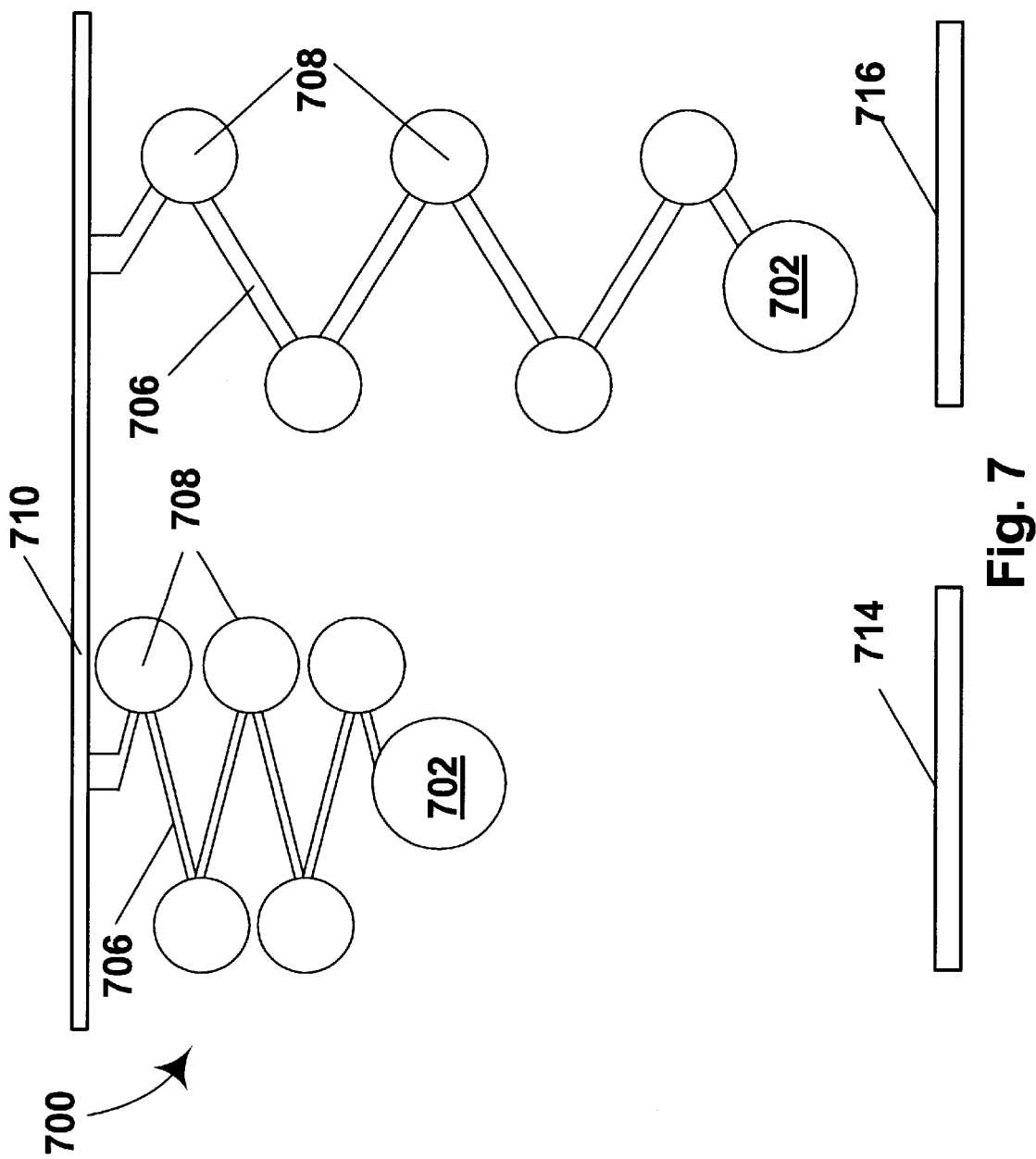
FIG. 7 is a schematic side elevation showing two different states of a sixth electrophoretic display of the invention, the units of this display being generally similar to that shown in FIGS. 6A and 6B except that one end of the filament is attached to a fixed body.

FIG. 7 illustrates a modification of the type of display shown in FIGS. 6A and 6B. Each of the units 700 shown in FIG. 7 is generally similar to that shown in FIGS. 6A and 6B, except that, instead of charged particles being provided at both ends of a filament, a (positively) charged particle 702 is provided at only one end of a filament 706, the other end of the filament 706 being bonded directly to a fixed body, in this case an electrode 710 (in the case of an encapsulated display, the fixed body could be the wall of a microcapsule). Nanoparticles 708 are attached at intervals along the filament 706 in the manner already described.

FIG. 7 illustrates schematically the units 700 being used with a V/2 addressing scheme in which the common front electrode 710, to which the units 700 are attached, is held at +V/2, while two discrete rear electrodes 714 and 716 respectively are held at +V and 0 respectively. The left hand side of FIG. 7 shows electrode 714 held at +V, a higher potential than the front electrode 710. Accordingly, the positively charged particle 702 of unit 700 is repelled from electrode 714, and the unit 700 assumes a compact conformation similar to that shown in FIG. 6A, so that the color displayed is that of the aggregated nanoparticles 708. The right hand side of FIGS. 7 shows electrode 716 held at 0, so that particle 702 is attracted to this electrode, and the unit 700 assumes an extended conformation similar to that shown in FIG. 6B and the color displayed is that of the dispersed nanoparticles 708. As with the unit 600 shown in FIGS. 6A and 6B, intermediate conformations, and hence gray scale, can be achieved. Also, the unit 700 is capable of rapid switching.

Figure 8:
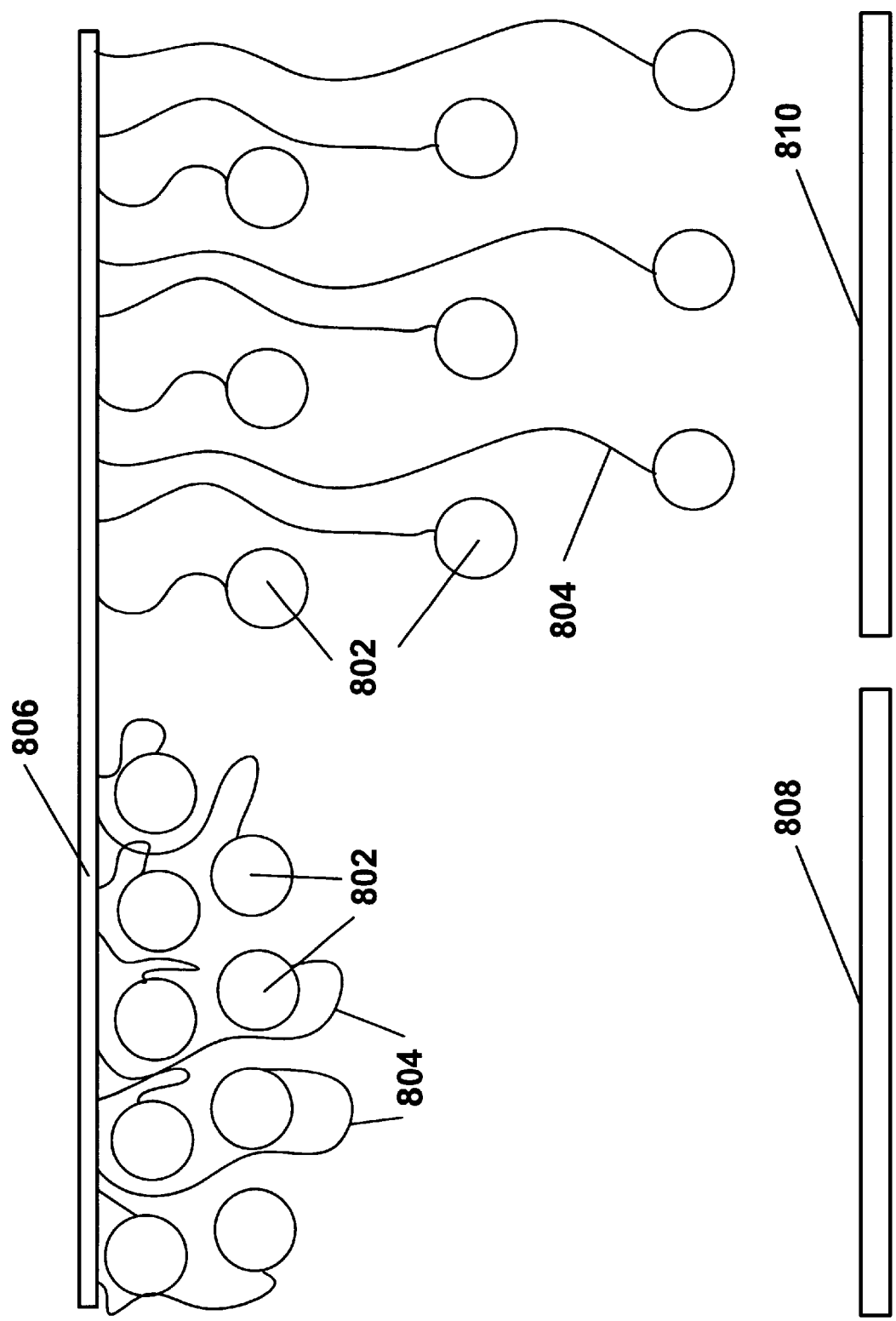
FIG. 8 is a schematic side elevation showing two different states of a seventh electrophoretic display of the invention is which a plurality of nanoparticles are individually tethered to a fixed body.

FIG. 8 shows a display of the present invention in which a large number of charged nanoparticles 802 (for purposes of illustration, the charge is assumed to be positive, and the number of nanoparticles is greatly reduced in FIG. 8 for ease of illustration) are tethered by filaments 804 of varying length to a fixed body, namely an electrode 806. In the same manner as in FIG. 7, the left hand side of FIG. 7 shows an electrode 808 held at +V, a higher potential than the electrode 806 to which the nanoparticles 802 are tethered. Accordingly, the positively charged nanoparticles 802 are repelled from electrode 808 and lie closely adjacent electrode 806. Thus, the nanoparticles 802 assume a close-packed configuration, so that the color displayed is that of the aggregated nanoparticles 802. The right hand side of FIG. 8 shows an electrode 810 held at 0, so that nanoparticles 802 is attracted to this electrode, and are spaced from the electrode 806 to the extent permitted by the lengths of their individual filaments 804. Thus, the nanoparticles 802 are separated from one another, and the color displayed is that of the dispersed nanoparticles 802. As with the displays previously discussed with reference to FIGS. 6A, 6B and 7, the display shown in FIG. 8 can achieve gray scale and is capable of rapid switching.

Figure 9A:
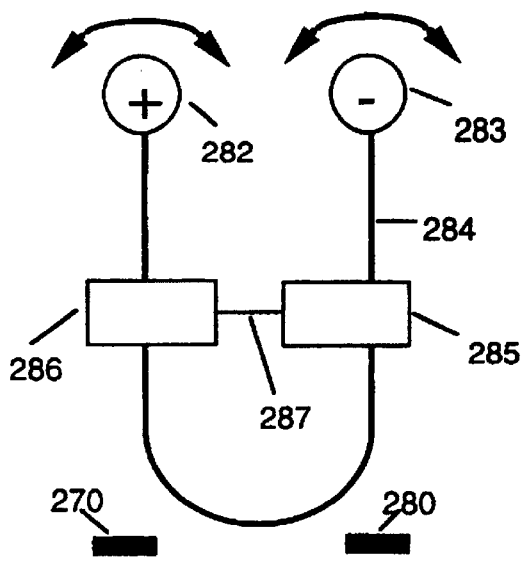
FIGS. 9A–9H illustrate various types of units generally useful in the electrophoretic displays of the invention, these units being generally similar to that shown in FIGS. 5A and 5B.
Figure 9C:
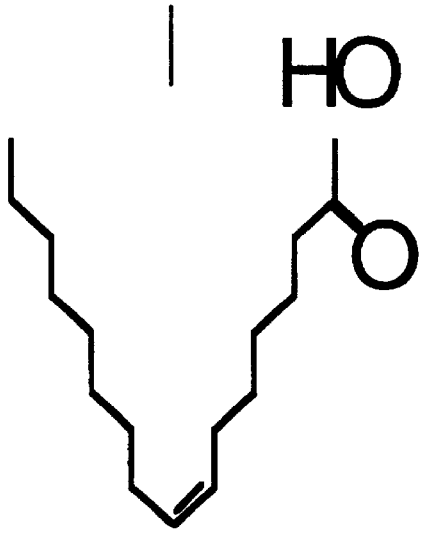
Figure 9B:
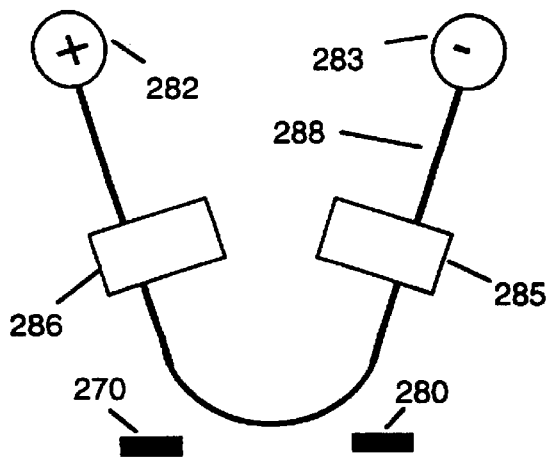

FIGS. 9A–9H illustrate embodiments of the invention which may be regarded as variations on the general type of system shown in FIGS. 5A and 5B in that they comprise two particles bearing opposing charges and being linked by a member which may be described as a filament. The embodiments are intended to be switched by in-plane electrodes 270 and 280, and some of them are intended to provide a first color change by means of applying an AC field and a second color change by means of application of either a DC field or an AC field of another frequency. Referring to FIGS. 9A–9B a hairpin shaped molecule or spring in the closed state 284 may have attached to it a positively charged 282 and a negatively charged 283 head; instead of net electric charge, these heads may have strong dipole moments. Additionally one side of said hairpin shaped molecule or spring has attached to it a leuco dye 286 and the other side of said hairpin shaped molecule or spring has attached to it a reducing agent 285. When said molecule or spring is in the closed state 284 then said leuco dye 286 and said reducing agent 285 are brought into proximity such that a bond is formed 287 and said leuco dye is effectively reduced thus effecting a first color state. Upon a applying an AC electric field with frequency that is resonant with the vibrational mode of said charged heads cantilevered on said hairpin shaped molecule or spring said bond 287 may be made to break thus yielding an open state 288. In said open state the leuco dye and reducing agent are no longer proximal and the leuco dye, being in a non-reduced state, effects a second color state. The system may be reversed by applying a DC electric field which serves to reproximate the leuco dye and reducing agent groups. Many molecules or microfabricated structures may serve as the normally open hairpin shaped molecule or spring. These may include oleic acid like molecules 289. Reducing agents may include sodium dithionite. The system as discussed is bistable.

Figure 9D:
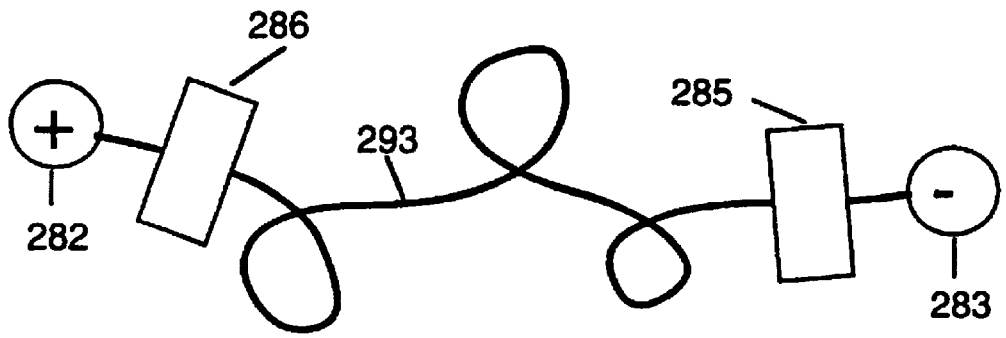
Figure 9E:
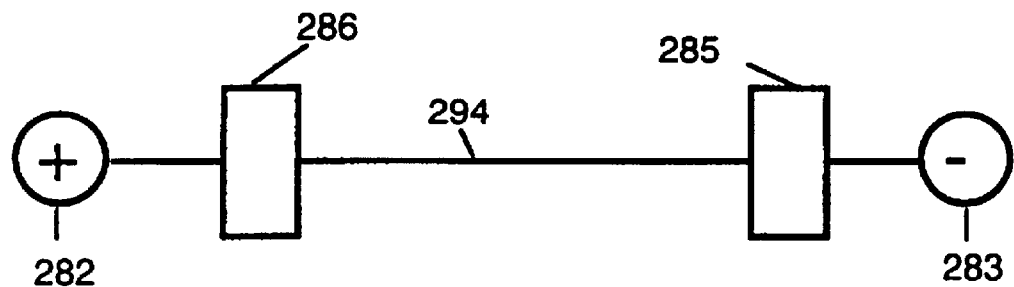
Figure 9F:
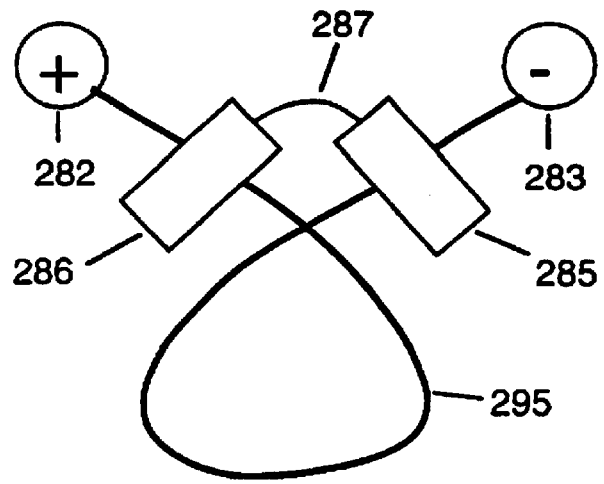

Referring to FIGS. 9D–9F an alternative leuco dye-reducing agent system may employ a polymer shown in FIG. 9D in a natural state 293. When a DC electric field is applied said polymer assumes a linear shape 294 with leuco 286 and reducing agent 285 groups spaced from each other. Upon application of either a reversing DC field or an AC electric field said polymer will tend to coil bringing into random contact said leuco and reducing groups forming a bond 287 with a corresponding color change. Said polymer serves to make said system bistable.

Figure 9G:
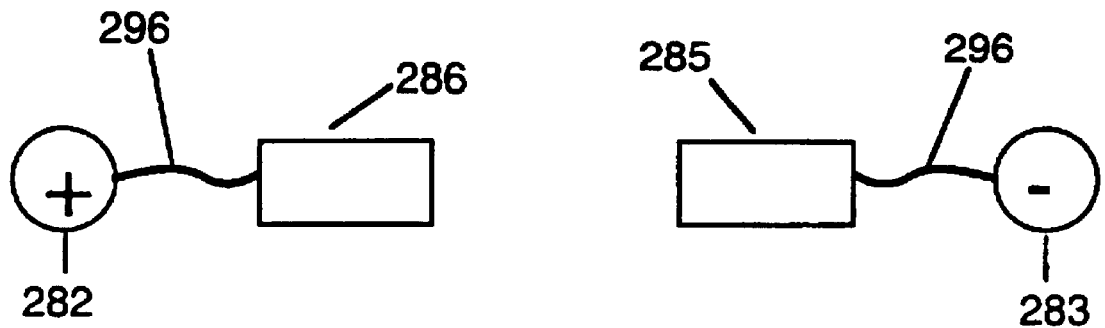
Figure 9H:
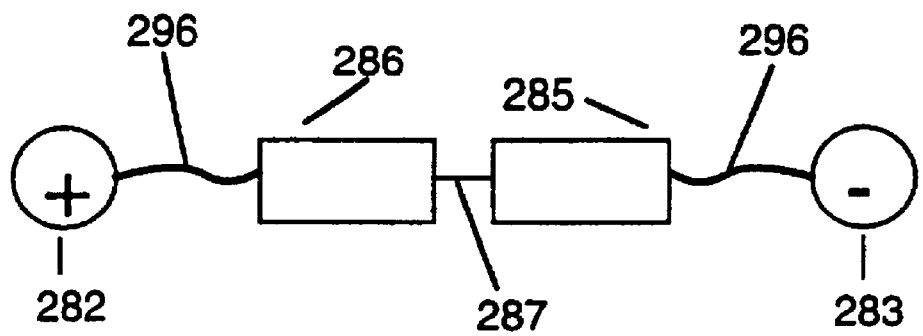

Referring to FIGS. 9G and 9H a similar system is possible but instead of a polymer leuco and reducing groups may be attached to oppositely charge microspheres directly by means of a bridge 296 which may be a biotin-streptavidin bridge, polymer bridge or any other suitable bridge. As before application of a DC field cause leuco and reducing groups to become distal whereas application of a reverse DC field or AC field brings into random contact the leuco and reducing groups. A polymer may be added to aid in the stability of the oxidized state.

Apart from the use of nanoparticles in place of the larger pigment particles used in prior art electrophoretic displays, the displays of the present invention can employ most of the technology used in the prior art electrophoretic displays. Thus, preferred embodiments of the present invention can provide encapsulated electrophoretic displays that provide a flexible, reflective display that can be manufactured easily and consume little power (or no power in the case of bistable displays in certain states), as well as materials and methods useful in their construction. (Note that although in theory states such as those shown in FIGS. 2B, 2C, 3B and 3C might not appear to be stable, in that the nanoparticles should become randomly dispersed throughout the suspending fluid when the electric field is removed, in practice there will be often sufficient nanoparticle/microcapsule wall interaction to render such states stable, at least for periods of time which are long compared to the switching time of the display.) Such displays, therefore, can be incorporated into a variety of applications.

As already indicated, it is preferred that certain embodiments of the invention, such as the those shown in FIGS. 2A–2C and 3A–3C, be encapsulated, whereas other embodiments, such as those shown in FIGS. 7 and 8 will typically not be encapsulated. The following description of preferred embodiments of the invention will focus on such encapsulated electrophoretic displays, since it is believed that those skilled in display technology will have no difficulty in adapting the teachings below for use with non-encapsulated displays.

An encapsulated electrophoretic display may take many forms. The display may include capsules dispersed in a binder. The capsules may be of any size or shape. The capsules may, for example, be spherical and may have diameters in the millimeter range or the micron range, but are preferably from about ten to about a few hundred microns. The capsules may be formed by any conventional encapsulation technique. The nanoparticles may be colored, luminescent, light-absorbing or transparent, for example. The nanoparticles may include neat pigments, dyed (laked) pigments or pigment/polymer composites, for example.

The successful construction of an encapsulated electrophoretic display requires the proper interaction of all these materials and processes. Materials such as a polymeric binder (for example, for binding the capsules to a substrate), nanoparticles, fluid, and a capsule membrane must all be chemically compatible. The capsule membranes may engage in useful surface interactions with the nanoparticles, or may act as an inert physical boundary between the fluid and the binder. Polymer binders may act as adhesives between capsule membranes and electrode surfaces.

Materials for use in creating electrophoretic displays relate to the types of materials, including, but not limited to, nanoparticles, dyes, suspending fluids, and binders used in fabricating the displays. The nanoparticles may include scattering pigments, absorbing pigments and luminescent particles. Such particles may also be transparent. When titania is used as a nanoparticle, it may be coated in one or two layers with a metal oxide, such as aluminum oxide or silicon oxide, for example. Luminescent particles may include, for example, zinc sulfide particles. The zinc sulfide particles may also be encapsulated with an insulative coating to reduce electrical conduction. Types of dyes for use in electrophoretic displays are commonly known in the art. Useful dyes are typically soluble in the suspending fluid, and may further be part of a polymeric chain. Dyes may be polymerized by thermal, photochemical, and chemical diffusion processes. Single dyes or mixtures of dyes may also be used.

Furthermore, capsules may be formed in, or later dispersed in, a binder. Materials for use as binders include water-soluble polymers, water-dispersed polymers, oil-soluble polymers, thermoset polymers, thermoplastic polymers, and radiation-cured (for example, UV-cured) polymers. The materials used as substrates to support and as electrodes to address electrophoretic displays must also be compatible with the materials and processes that are described above.

In some cases, a separate encapsulation step is not necessary to form the microcapsules. The electrophoretic fluid may be directly dispersed or emulsified into the binder (or a precursor to the binder material) to form what may be called a "polymer-dispersed electrophoretic display." In such displays, the individual electrophoretic phases may be referred to as capsules or microcapsules even though no capsule membrane is present. Such polymer-dispersed electrophoretic displays are considered to be subsets of encapsulated electrophoretic displays.

In an encapsulated electrophoretic display, the binder material surrounds the capsules and (in a typical two permanent electrode system) separates the two electrodes. This binder material must be compatible with the capsule and bounding electrodes and must possess properties that allow for facile printing or coating. It may also possess barrier properties for water, oxygen, ultraviolet light, the electrophoretic fluid, or other materials, Further, it may contain surfactants and cross-linking agents, which could aid in coating or durability. The polymer-dispersed electrophoretic display may be of the emulsion or phase separation type.

In some embodiments of the present invention, the polymer in the polymeric binder is capable of being dried, crosslinked, or otherwise cured as in traditional inks, and therefore a printing process can be used to deposit the microencapsulated electrophoretic medium ("electronic ink") onto a substrate. An electronic ink is capable of being printed by several different processes, depending on the mechanical properties of the specific ink employed. For example, the fragility or viscosity of a particular ink may result in a different process selection. A very viscous ink would not be well-suited to deposition by an ink jet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays, such as those of the present invention, have the advantages that they can be addressed by DC voltages and draw very little current. As such, the conductive leads and electrodes used to deliver the voltage to electronic ink displays can be of relatively high resistivity. The ability to use leads and electrodes of lower conductivity substantially widens the number and type of materials that can be used in these components of electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly(3,4-ethylenedioxythiophene) (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

As an example, there is a class of materials called electroconductive powders which are also useful as coatable transparent conductors in electronic ink displays. One example is Zelec ECP electroconductive powders from DuPont Chemical Co. of Wilmington, Del.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An electrophoretic display comprising a fluid and a plurality of nanoparticles having diameters substantially less than the wavelengths of visible light such that, when the nanoparticles are in a dispersed state and uniformly dispersed throughout the fluid, the fluid presents a first optical characteristic, but when the nanoparticles are in an aggregated state in which they are gathered into aggregates substantially larger than the individual nanoparticles, the fluid presents a second optical characteristic different from the first optical characteristic, the electrophoretic display further comprising at least one electrode arranged to apply an electric field to the nanoparticle-containing fluid and thereby move the nanoparticles between their dispersed and aggregated states.

2. An electrophoretic display according to claim 1 wherein the nanoparticles have an average diameter not in excess of about 200 nm.

3. An electrophoretic display according to claim 2 wherein the nanoparticles have an average diameter not in excess of about 100 nm.

4. An electrophoretic display according to claim 3 wherein the nanoparticles have an average diameter not in excess of about 50 nm.

5. An electrophoretic display according to claim 1 wherein the nanoparticles comprise at least one insulator.

6. An electrophoretic display according to claim 5 wherein the nanoparticles comprise titanium dioxide.

7. An electrophoretic display according to claim 5 wherein the nanoparticles comprise any one or more of zinc oxide, a clay and magnesium silicate.

8. An electrophoretic display according to claim 1 wherein the first optical characteristic is a low level of light scattering and the second optical characteristic is a substantially increased level of light scattering.

9. An electrophoretic display according to claim 1 wherein the nanoparticles comprise at least one conductor.

10. An electrophoretic display according to claim 9 wherein the nanoparticles comprise silver or gold.

11. An electrophoretic display according to claim 1 wherein the nanoparticles comprise at least one semiconductor.

12. An electrophoretic display according to claim 11 wherein the nanoparticles comprise cadmium selenide.

13. An electrophoretic display according to claim 1 wherein the first and second optical characteristics are differing colors.

14. An electrophoretic display according to claim 1 wherein the fluid and the nanoparticles are encapsulated within at least one capsule.

15. An electrophoretic display according to claim 14 wherein the fluid and the nanoparticles are encapsulated within a plurality of microcapsules having diameters in the range of from about 10 to about 500 $\mu$m.

16. An electrophoretic display according to claim 1 wherein the fluid is colored.

17. An electrophoretic display according to claim 1 wherein the fluid comprises a hydrocarbon.

18. An electrophoretic display according to claim 1 comprising at least two different species of nanoparticles having different electrophoretic mobilities.

19. An electrophoretic display according to claim 18 wherein the two different species of nanoparticles have charges of opposite polarity.

20. An electrophoretic display according to claim 1 wherein at least some of the nanoparticles are in the form of units each comprising a plurality of nanoparticles attached to a single substrate, such that upon application of an electric field to the units, the distances between nanoparticles within the unit will change, thereby changing the optical characteristic displayed by the unit.

21. An electrophoretic display according to claim 20 wherein the unit comprises at least two nanoparticles connected by a flexible filament.

22. An electrophoretic display according to claim 20 wherein the unit comprises an elongate flexible filament having one end attached to a fixed body and having an electrically charged body affixed at or adjacent its opposed end, the filament having a plurality of nanoparticles fixed thereto at spaced intervals between the fixed body and the electrically charged body, such that upon application of an electric field to the unit, the spacing between the fixed body and the electrically charged body will change, thereby changing the distances between the nanoparticles.

23. An electrophoretic display according to claim 20 wherein the unit comprises an elongate flexible filament having one end attached to a first electrically charged body and its opposed end attached to a second electrically charged body bearing a charge of opposite polarity to the first electrically charged body, the filament having a plurality of nanoparticles fixed thereto at spaced intervals between the two electrically charged bodies, such that upon application of an electric field to the unit, the spacing between the two electrically charged bodies will change, thereby changing the distances between the nanoparticles.

24. An electrophoretic display according to claim 1 wherein at least some of the nanoparticles bear an electrical charge and are attached via flexible filaments to a fixed body, such that upon application of an electrical field to the nanoparticles the spacing between the nanoparticles and the fixed body will vary.

25. An electrophoretic display according to claim 1 having a viewing surface through which the nanoparticle-containing fluid can be viewed, and on the opposed side of the display from the viewing surface, a light source arranged to pass light through the nanoparticle containing fluid, and wherein the first optical characteristic is a low level of light scattering and the second optical characteristic is a substantially increased level of light scattering, so that the nanoparticle-containing fluid acts as a light valve.

26. An electrophoretic display according to claim 1 having a viewing surface through which the nanoparticle-containing fluid can be viewed, and on the opposed side of the display from the viewing surface, a reflective or colored surface, and wherein the first optical characteristic is a low level of light scattering and the second optical characteristic is a substantially increased level of light scattering, so that when the nanoparticles are in their dispersed state an observer viewing the viewing surface of the display will see the reflective or colored surface, whereas when the nanoparticles are in their aggregated state such a viewer will see the color of the aggregated nanoparticles.

27. An electrophoretic display according to claim 1 having two electrodes disposed on opposed sides of the nanoparticle-containing fluid, at least one of the electrodes being substantially transparent.

28. An electrophoretic display according to claim 1 having two electrodes disposed on the same side of the nanoparticle-containing fluid, so that the opposed side of the nanoparticle-containing fluid constitutes a viewing surface through which the nanoparticle-containing fluid can be viewed.

* * * * *

UNITED STATES PATENT AND TRADEMARK OFFICE
CERTIFICATE OF CORRECTION

PATENT NO. : 6,323,989 B1
DATED : November 27, 2001
INVENTOR(S) : Jacobson et al.

It is certified that error appears in the above-identified patent and that said Letters Patent is hereby corrected as shown below:

Title page,
Item [60], Related U.S. Application Data, replace "09/471,024" with -- 09/471,604 --.
Item [30], delete the entire section reading
"[30]     Foreign Application Priority Data
Dec. 28, 1998   (JP) ………………….. 10-373144".

Column 1,
Line 7, replace "09/471,024" with -- 09/471,604 --.

Signed and Sealed this

Eleventh Day of October, 2005

JON W. DUDAS
*Director of the United States Patent and Trademark Office*